United States Patent
Sonoda et al.

(10) Patent No.: US 7,273,540 B2
(45) Date of Patent: Sep. 25, 2007

(54) TIN-SILVER-COPPER PLATING SOLUTION, PLATING FILM CONTAINING THE SAME, AND METHOD FOR FORMING THE PLATING FILM

(75) Inventors: Hiromi Sonoda, Kitakyushu (JP); Katsuji Nakamura, Kitakyushu (JP)

(73) Assignee: Shinryo Electronics Co., Ltd., Kitakyushu-shi (JP)

( * ) Notice: Subject to any disclaimer, the term of this patent is extended or adjusted under 35 U.S.C. 154(b) by 152 days.

(21) Appl. No.: 11/039,841

(22) Filed: Jan. 24, 2005

(65) Prior Publication Data

US 2005/0184369 A1    Aug. 25, 2005

Related U.S. Application Data

(63) Continuation of application No. PCT/JP03/09351, filed on Jul. 23, 2003.

(30) Foreign Application Priority Data

Jul. 25, 2002 (JP) ............... 2002-216881
Oct. 9, 2002 (JP) ............... 2002-296460

(51) Int. Cl.
 *C25D 3/58* (2006.01)
 *C25D 3/60* (2006.01)
(52) U.S. Cl. ............... 205/241; 205/242; 205/252; 205/253; 205/254
(58) Field of Classification Search .............. 205/241, 205/242, 252, 253, 254
See application file for complete search history.

(56) References Cited

U.S. PATENT DOCUMENTS

3,769,182 A * 10/1973 Beckwith et al. ........... 205/253
5,527,628 A    6/1996 Anderson et al. ........... 428/647
6,365,017 B1   4/2002 Hongo et al. ............... 204/212
6,607,653 B1   8/2003 Tsuji et al. ................. 205/241

FOREIGN PATENT DOCUMENTS

JP    55115986 A  *  9/1980

(Continued)

OTHER PUBLICATIONS

Van Horn, "Pulse Plating", Dynatronix (Aug. 5, 1999), pp. 1-13.*
Kiichi Nakamura, "Recent Circumstances for Lead-free Concept in view of Electric Component Manufactures" Electronic Packaging Technology, Jul. 20, 1999, vol. 15, No. 8, pp. 20-26 (w/ English translation).

(Continued)

*Primary Examiner*—Edna Wong
(74) *Attorney, Agent, or Firm*—Oblon, Spivak, McClelland, Maier & Neustadt, P.C.

(57) ABSTRACT

An electrolytic plating method, including: preparing a plating solution including water which is a primary medium, a sulfonic acid, and tin, copper, and silver ions, and a complexing agent, concentrations of the sulfonic acid, and tin, copper, and silver ions being 0.5 to 5 mol/L, 0.21 to 2 mol/L, 0.002 to 0.02 mol/L, and 0.01 to 0.1 mol/L, respectively, a mole ratio of the silver-ion concentration to the copper-ion concentration being in a range of 4.5 to 5.58; and separating a solution around a soluble anode containing 90 percent or more of tin from the plating solution on a cathode side by a non-ionic micro-porous membrane having a pore diameter of 0.01 to 0.05 μm and a thickness of 5 to 100 μm.

15 Claims, 5 Drawing Sheets

FOREIGN PATENT DOCUMENTS

| | | | |
|---|---|---|---|
| JP | 56-112500 | | 6/1981 |
| JP | 04024440 A | * | 1/1992 |
| JP | 4-24440 | | 4/1992 |
| JP | 5-50286 | | 3/1993 |
| JP | 6-74520 | | 9/1994 |
| JP | 9-143786 | | 6/1997 |
| JP | 11-21692 | | 1/1999 |
| JP | 11-21693 | | 1/1999 |
| JP | 2000-219993 | | 8/2000 |
| JP | 2000219993 A | * | 8/2000 |
| JP | 3104704 | | 9/2000 |
| JP | 2001-164396 | | 6/2001 |
| WO | WO00/14308 | | 3/2000 |

OTHER PUBLICATIONS

Kazuhiro Shiba et al., "Electrocrystallization of Sn-0.7Cu-0.3Ag Ternary Alloy from Methanesulfonic Acid Bath and Effect of T3HPP on Bath Stability", Resume of the 103rd Symposium of the Surface Finishing Society of Japan, Mar. 5, 2001, pp. 54-55 (w/ English translation).

Mitsunobu Fukuda et al., "Sn-Ag-Cu Alloy Plating for Lead-Free Solder", Resume of the 103rd Symposium of the Surface Finishing Society of Japan, Mar. 5, 2001, p. 58 (w/ English translation).

* cited by examiner ary, an amount of chemical liquid handled is so large and the bath is used for such a long time that solids may occur or characteristic of the solution may change during plating processes, which causes problems such as unstable plating quality and so on. Moreover, especially in the case of producing a plating solution having a high metal-ion concentration, there are following problems. If a soluble anode having 90 percent or more of tin is used, silver ions tend to precipitate as silver compounds or metal silver by substitution with tin of the soluble anode, which deteriorates stability of the solution. On the other hand, if an insoluble electrode is used, insoluble precipitates are generated as $Sn^{2+}$ are oxidized to $Sn^{4+}$ around the insoluble electrode, which degrades the quality of the solution.

TIN-SILVER-COPPER PLATING SOLUTION, PLATING FILM CONTAINING THE SAME, AND METHOD FOR FORMING THE PLATING FILM

This application is a continuation of PCT/JP03/09351 filed on Jul. 23, 2003.

TECHNICAL FIELD

The present invention relates to a tin-silver-copper plating solution used for a lead-free solder plating, a plating method using the same, and a plating film and a soldering method thereof.

BACKGROUND ART

Conventionally, tin plating or tin-lead alloy plating has been performed on components to be soldered, for instance components which constitute electronic equipment such as chip parts, crystal oscillators, bumps, connector pins, lead frames, various hoop materials, lead pins of packages and circuits of printed boards. The pure tin plating has problems such as deterioration in solderability and occurrence of whisker-shaped crystals (whiskers) on a film. Furthermore, the use of lead has recently been reduced from a standpoint of environmental protection; thus, lead-free plating has become desirable.

As the lead-free plating, for example, a tin-silver alloy, a tin-bismuth alloy, a tin-copper alloy and the like have been considered. However, there are some drawbacks that a plating bath of the tin-silver alloy easily becomes unstable and a plating film of the tin-bismuth alloy tends to generate cracks.

On the other hand, the tin-copper alloy hardly generates cracks and has superior joining strength but has a drawback that a melting point is high. In tin-copper alloy plating, a plating bath containing certain organic compounds and also a tin-silver-copper alloy plating bath are disclosed in, e.g. Japanese Patent Publication Laid-Open No. 2001-164396 (hereinafter referred to as Patent Document 1).

Moreover, a solder material used for a board to be joined with a plating film is also desired to be lead-free. For instance, the tin-silver-copper alloy having a composition close to a eutectic point has been in-use as the solder material as disclosed in Japanese Patent Publication Laid-Open No.H5-50286 and U.S. Pat. No. 5,527,628 (hereinafter referred to as Patent Documents 2 and 3, respectively). If a plating film having a composition similar to that of the solder material of the board is used, it is expected to lower energy cost at the time of joining and to improve joinability. Besides the aforementioned Patent Document 1, some results related to a tin-silver-copper plating solution and production of a plating film using the plating solution are disclosed, e.g. in "Electrocrystallization of Sn-0.7Cu-0.3Ag Ternary Alloy from Methanesulfonic Acid Bath and Effect of T3HPP on Bath Stability" (hereinafter referred to as Non-patent Document 1) in the Resume of the 103rd Symposium of the Surface Finishing Society of Japan, page 54, disclosed on Mar. 5, 2001, and also in "Sn—Ag—Cu Alloy Plating for Lead-Free Solder" (hereinafter referred to as Non-patent Document 2) in the Resume of the 103rd Symposium of the Surface Finishing Society of Japan, page 58, disclosed on Mar. 5, 2001.

However, the compositions of the plating baths disclosed specifically in Patent Document 1, Non-patent Documents 1 and 2 are disadvantageous in that each metal concentration is low or out of balance. The plating baths have a further problem with productivity for using in industrial plating because of instability of the plating solutions. In addition, although the tin-silver-copper alloy-plating bath is superior to the tin-copper alloy-plating bath in solder wettability, solution stability and soldering strength, the preparation thereof is difficult because it contains three kinds of metal ions and complexes thereof. On an industrial scale, particul Furthermore, a conventionally known lead-free plating film has a melting point higher than that of a tin-lead plating film by about 20° C. Thus, a lead-free plating film having a lower melting point has been desired to reduce the energy cost at the time of joining and to reduce an amount of heat applied to other components.

Moreover, the solder material used for the board to be joined with the plating film is also desired to be lead-free, and for example, the tin-silver-copper alloy having the approximate eutectic composition has been in-use as the solder material. However, a plating film having a composition similar to that of the tin-silver-copper alloy has not been obtained due to the difficulty in producing the plating solution as described above. Consequently, the plating film which has good joinability with the solder material using the tin-silver-copper alloy has been desired.

An object of the present invention is to provide the tin-silver-copper plating solution having less solid precipitations and better storage stability over a long time. Another object of the present invention is to provide an electrolytic plating method of the tin-silver-copper plating solution whereby quality deterioration hardly occurs even if a plating process is continuously performed in a large amount. The electrolytic plating method also makes it possible that a plating process can be carried out with a higher current density. Furthermore, the present invention collaterally aims to provide the plating film having a low melting point, less cracks and better joining strength and a soldering method using the plating film whereby the mounting can be carried out at a lower heating temperature.

DISCLOSURE OF INVENTION

A tin-silver-copper plating solution according to a first invention for attaining the above objects comprises water which is a primary medium, a sulfonic acid, tin ions, copper ions and silver ions, wherein a concentration of the silver ions is 0.01 to 0.1 mol/L (liter). Generally, controlling the silver-ion concentration in the tin-silver-copper plating solution is very difficult. The tin-silver-copper plating solution according to the first invention has the silver-ion concentration in a range of 0.01 to 0.1 mol/L and concentrations of the tin and copper ions are determined based on the silver-ion concentration. In this manner, obtained is the tin-silver-copper plating solution with less solid precipitations and better storage stability over a long time without causing quality deterioration even when a plating process is performed continuously in a large amount.

In this case, the tin-silver-copper plating solution of the first invention preferably has the concentrations of the tin ions in a range of 0.21 to 2 mol/L and of the copper ions in a range of 0.002 to 0.02 mol/L. Moreover, it is preferable to set a mole ratio of the silver-ion concentration to the copper-ion concentration in a range of 4.5 to 5.58. Here, it is possible to perform plating with a tin-silver-copper alloy having a lower melting point efficiently (namely, with high productivity) by determining the respective metal-ion concentrations within the above ranges. In addition, it is more preferable to set the concentrations of the tin ions, silver ions and copper ions in ranges of 0.3 to 1 mol/L, 0.02 to 0.05 mol/L and 0.003 to 0.01 mol/L, respectively. It is further preferable to set the ratio (mole ratio) of silver-ion concentration to the copper-ion concentration in a range of 4.5 to 5.5. As a result, tin-silver-copper alloy plating with a lower melting point can be performed.

In the tin-silver-copper plating solution according to the first invention, a concentration of the sulfonic acid is more preferably 0.5 to 5 mol/L. Tin-, silver- and copper-compounds having low water-solubility may not dissolve in water if the sulfonic acid concentration is less than 0.5 mol/L. The metal-ion concentration may temporarily become too high to obtain a homogeneous plating solution if the sulfonic acid concentration is more than 5 mol/L.

In the tin-silver-copper plating solution according to the first invention, it is preferable that the plating solution further contains a mercaptan compound or an aromatic amino compound. Since the mercaptan compound or the aromatic amino compound is contained in the solution, the tin ions, copper ions and silver ions are stabilized by becoming complex compounds. If both of the mercaptan compound and aromatic amino compound are contained in the solution, the formed complex compounds become more stabilized.

Furthermore, the tin-silver-copper plating solution according to the first invention can contain a nonionic surfactant. By including the nonionic surfactant in the solution, appearance, fineness, smoothness, adhesiveness and homogeneous electrodeposition of the plating film improve.

In an electrolytic plating method according to a second invention for attaining the above objects, an appropriate range of current density to a metal substrate which is an object to be plated at the time of plating is in a range of 0.01 to 100 A/dm² in the plating method according to the first invention. Accordingly, the method can be applied to not only a thin plating film but also a thick plating film. Still preferably, the method can be applied to high-speed plating and form a stable plating layer by determining the current density in a range of 4 to 50 A/dm² (more preferably 20 to 50 A/dm²).

In the electrolytic plating method according to the second invention, either an electric current with a pulse current waveform or an electric current with a flat direct-current waveform having no ripple may be used at the time of plating. Using the electric current with the pulse current waveform allows a gloss plating film to be obtained. The electric current with the direct-current waveform allows a semi-gloss plating film to be obtained. By setting the direct-current voltage at 1.9 V or below, still preferably, in a range of 0.2 to 1.2 V, a beautiful semi-gloss plating film can be obtained with high productivity.

In the electrolytic plating method according to the second invention, not only a soluble anode containing 90 percent or more of tin but also an insoluble anode is used, and plating current may be applied to both of the soluble anode and insoluble anode. Generally in an electrolytic plating method of a tin-based alloy, the electric current necessary for plating an object with a plating metal is applied to a soluble anode having 90 percent or more of tin. In the general electrolytic plating, if a soluble anode having 100 percent of tin is used, for example, a dissolution amount of the soluble anode contains not only a dissolution amount of tin corresponding to the applied current amount but also an amount of tin chemically dissolved by an acid-containing solution around the anode. Accordingly, if the electric current necessary for plating is applied only to the soluble anode, tin dissolves excessively. This excessive amount comprises the chemical dissolution amount of the soluble anode and a tin dissolution amount corresponding to an amount of current which precipitates metals except tin on a cathode. This dissolution of tin causes excessive increase of $Sn^{2+}$ concentration and disruption of ion balance in the solution. Further, $Sn^{2+}$ is oxidized to $Sn^{4+}$ around the anode and then the $Sn^{4+}$ precipitates and deposits as tin oxide, which generates a problem of deteriorating the solution quality.

Accordingly, the above problem can be solved by applying a part of current amount necessary for the plating to the soluble anode having 90 percent or more of tin, and by applying the rest of the current amount to the insoluble anode, the part of current amount applied to the soluble anode corresponding to an amount of tin to be plated from which the chemical dissolution amount of tin is subtracted.

In the electrolytic plating method according to the second invention, when the soluble anode and insoluble anode are both used, it is preferable that a diaphragm separates the solution around the soluble anode from the plating solution on the cathode side. In this case, it is more preferable to separate both the soluble anode and insoluble anode from the plating solution on the cathode side by the diaphragms.

Also, in the electrolytic plating method according to the second invention, it is preferable the soluble anode containing 90 percent or more of tin is used and the diaphragm separates the solution around the soluble anode from the plating solution on the cathode side.

In these cases, the diaphragm preferably has pores of 0.01 to 0.05 μm in diameter and a thickness of the diaphragm is 5 to 100 μm. Moreover, it is preferable to use a diaphragm that transfers bivalent tin ions in a range of $5\times10^{-5}$ to $6\times10^{-5}$ g or in a range of $5\times10^{-5}$ to $5\times10^{-4}$ g from the anode side to the cathode side when 1 coulomb of electricity is applied. Thus, the diaphragm allows tin ions to transfer from the anode side to the cathode side in a proper amount for replenishment as a constituent of the plating solution. At the same time, the diaphragm also prevents $Ag^+$ contained in the plating solution on the cathode side from transferring to the soluble anode side. This can decrease substitution and precipitation of silver or the like on the surface of the soluble anode. Here, "the solution around the soluble anode" denotes the solution on the anode side separated from the plating solution on the cathode side by the diaphragm, which may be in the form of a bag to cover the soluble anode or in the shape of a sheet.

In the electrolytic plating method according to the second invention, it is still preferable that a circulation path comprising a filtering membrane with pores of 0.05 to 0.5 μm in diameter is provided and the plating solution passes through the filtering membrane under a low pressure so as to remove impurities. It is possible to remove the impurities which cause deterioration of the solution quality, especially tin (IV) oxide, copper oxide and silver oxide, by applying the low pressure to the plating solution to allow the solution to pass through the filtering membrane having the pore size of 0.05 to 0.5 µm.

A tin-silver-copper plating film according to a third invention comprises 2.6 to 3.4 weight percent of silver, 0.4 to 0.7 weight percent of copper and the balance substantially tin. Since the contents of silver and copper are within the above ranges, the plating film can have a low melting point close to the eutectic point of a tin-silver-copper alloy and a mounting temperature can be lowered. In addition, the tin-silver-copper plating film according to the third invention preferably has a thickness of 3 to 20 µm. Consequently, uniform soldering having higher soldering strength can be performed. If the thickness thereof is less than 3 µm, the plating film is too thin, and thereby soldering becomes difficult and the soldering strength becomes weak. Meanwhile, if the thickness thereof is more than 20 µm, unevenness in the film occurs, which is wasteful.

A tin-silver-copper plating film according to a fourth invention is obtained by the electrolytic plating using the tin-silver-copper plating solution according to the first invention, and the film comprises 2.6 to 3.4 weight percent of silver, 0.4 to 0.7 weight percent of copper and the balance substantially tin. Also, a tin-silver-copper plating film according to a fifth invention is obtained by performing the electrolytic plating method according to the second invention, and the film comprises 2.6 to 3.4 weight percent of silver, 0.4 to 0.7 weight percent of copper and the balance substantially tin. Since the contents of silver and copper are within the above ranges, the tin-silver-copper plating films according to the fourth and fifth inventions can have a lower melting point close to the eutectic point of a tin-silver-copper alloy and mounting temperature can be lowered.

A laminated body according to a sixth invention comprises the tin-silver-copper plating film according to the third to fifth inventions on a metal substrate made of one of copper, nickel, iron and an alloy containing one or more thereof. The "laminated body" denotes herein a plurality of metal layers plated on the metal substrate (in plate shape or line shape). To be concrete, the laminated body comprises such as an undercoat plating at the bottom (e.g. a nickel plating layer), a middle plating layer which is corrosion-resistant (e.g. gold, silver or palladium plating layer) and a solder plating layer on the surface (i.e. the tin-silver-copper plating film layer according to the third to fifth inventions). The term "laminated body" also refers the tin-silver-copper plating film layer according to the third to fifth inventions plated directly on the metal substrate or the tin-silver-copper plating film layer with an undercoat plating layer plated thereunder.

An electronic component according to a seventh invention comprises the laminated body according to the sixth invention. The laminated body has the plating film comprising 2.6 to 3.4 weight percent of silver, 0.4 to 0.7 weight percent of copper and the balance substantially tin on the metal substrate made of any one of copper, nickel, iron and an alloy containing any one or more thereof. Therefore, the laminated body and the electronic component having the laminated body can be soldered with high joining strength. Also, heating temperature at the time of mounting can be lowered and desired conductivity can be secured.

Relating to an electronic circuit according to an eighth invention, the electronic component according to the seventh invention and the electronic circuit board are joined under heating (blazing), the electronic circuit board being provided with a solder material including an alloy comprising 2 to 4 weight percent of silver, 0.3 to 0.8 weight percent of copper and the balance substantially tin. Accordingly, the plating film of the laminated body in the electronic component and the solder material provided on the electronic circuit board become similar in composition, whereby joinability therebetween improves remarkably and also the heating temperature can be lowered when the electronic component is mounted.

In a soldering method according to a ninth invention, the electronic component according to the seventh invention and a board are joined under heating while they are in contact, the board being provided with a solder material comprising an alloy comprising 2 to 4 weight percent of silver, 0.3 to 0.8 weight percent of copper and the balance substantially tin. Since the plating film on the electronic component and the board provided with the solder material having a similar composition to that of the film are joined under heating while they are in contact with each other, the soldering method with remarkably good joinability can be provided.

In the soldering method according to the ninth invention, a maximum heating temperature for joining the electronic component and the board is preferably in a range of 220 to 260° C. If the maximum heating temperature is less than 220° C., the plating film and solder are hard to melt. As a result, soldering becomes difficult to perform. Meanwhile, if the maximum temperature is higher than 260° C., the electronic components may be damaged. In the case of the maximum temperature being in the preferable range, energy saving and cost reduction can be realized at the same time.

Figure 1:
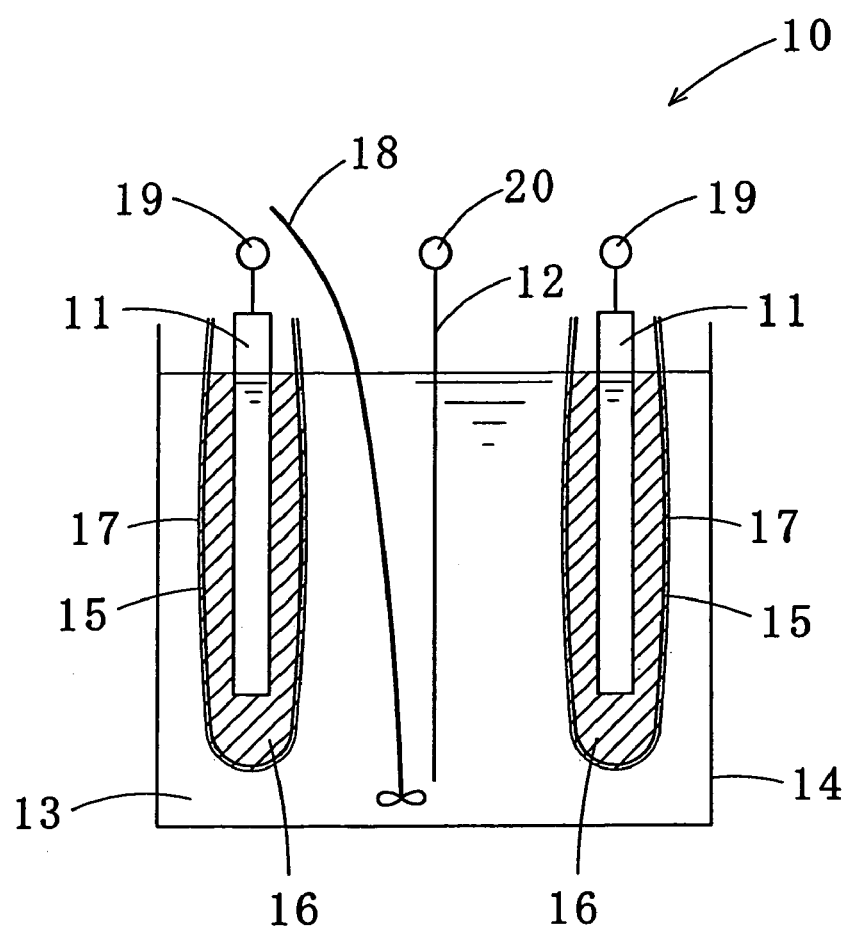
FIG. 1 is an illustrating view of an electrolytic plating apparatus used in an electrolytic plating method using a tin-silver-copper plating solution according to a first embodiment of the present invention.

BEST MODE FOR CARRYING OUT THE INVENTION (Plating Solution)

A tin-silver-copper plating solution according to one embodiment of the present invention (hereinafter also referred to as simply "plating solution") indispensably contains a sulfonic acid and tin, silver and copper as metal constituents in a medium mainly comprising water.

The metal constituents exist as metal ions in the plating solution that is obtained by mixing metal compounds in a plating mother liquid mainly comprising water and the sulfonic acid. The plating solution preferably includes an organic complexing agent to stabilize the metal ions.

Tin compounds include tin (II) compounds such as tin salts of organic sulfonic acids such as methanesulfonic acid, ethanesulfonic acid, 2-propanol sulfonic acid and p-phenolsulfonic acid; tin sulfate; tin oxide; tin nitrate; tin chloride; tin bromide; tin iodide; tin phosphate; tin pyrophosphate; tin acetate; tin formate; tin citrate; tin gluconate; tin tartrate; tin lactate; tin succinate; tin sulfamate; tin tetrafluoroborate; tin hexafluorosilicate and the like. Each of these tin compounds can be used individually or in a mixture of two or more of them.

Copper compounds include copper salts of the sulfonic acids listed above, copper sulfate, copper oxide, copper nitrate, copper chloride, copper bromide, copper iodide, copper phosphate, copper pyrophosphate, copper acetate, copper formate, copper citrate, copper gluconate, copper tartrate, copper lactate, copper succinate, copper sulfamate, copper tetrafluoroborate and copper hexafluorosilicate. Each of these copper compounds can be used individually or in a mixture of two or more of them.

Silver compounds include silver salts of the sulfonic acids listed above, silver sulfate, silver oxide, silver chloride, silver nitrate, silver bromide, silver iodide, silver phosphate, silver pyrophosphate, silver acetate, silver formate, silver citrate, silver gluconate, silver tartrate, silver lactate, silver succinate, silver sulfamate, silver tetrafluoroborate and silver hexafluorosilicate. Each of these silver compounds can be used individually or in a mixture of two or more of them.

Among these silver compounds, the silver oxide is preferably used due to its solubility and facility for industrial use.

Any sulfonic acid can be used as long as it dissolves the above metal constituents, for example, aliphatic sulfonic acids such as methanesulfonic acid and ethanesulfonic acid, benzenesulfonic acid and toluenesulfonic acid. Among these sulfonic acids, aliphatic sulfonic acids are preferable in view of solubility of metal salts and easiness for wastewater treatment. The methanesulfonic acid is especially preferable.

These sulfonic acids in the plating solution are preferably in a range of 0.5 to 5 mol/L, still preferably, in a range of 1 to 3 mol/L.

In the plating solution, the metal constituents are dissolved in a medium mainly comprising water in forms of metal ions and complexes of the metal ions with sulfonic acid ions, which are highly acidic ions, as counter anions. Tin ions exist as $Sn^{2+}$ and/or $Sn^{4+}$. Copper ions exist as $Cu^+$ and/or $Cu^{2+}$. Silver ions exist as $Ag^+$. Amounts of the respective metals in the plating solution are: 0.21 to 2 mol/L, preferably 0.25 to 1 mol/L of $Sn^{2+}$; 0.01 to 0.1 mol/L, preferably 0.02 to 0.05 mol/L of silver; and 0.002 to 0.02 mol/L, preferably 0.003 to 0.01 mol/L of copper. Here, since the tin ions involved in the plating are $Sn^{2+}$, the amount of $Sn^{2+}$ is controlled.

Furthermore, it is preferable that the silver-ion concentration to copper-ion concentration (mole ratio) is in a range of 4.5 to 5.58. Within this range, a tin-silver-copper plating film having a low melting point can be produced easily.

In addition, a diaphragm separates a solution around each anode from the plating solution on the cathode side depending on plating apparatuses. In that case, it is preferable to control at least the plating solution on the cathode side to be plated within the above ranges.

Also, when a composition of the tin-silver-copper ternary plating solution to be prepared is regulated by each content of tin, silver and copper, a composition of the plating film formed by using the plating solution is also regulated. Therefore, the composition of tin, silver and copper is determined so that a resultant plating film has as low a melting point as possible. Moreover, the solution can contain metal elements in such a trace amount as not to hinder the effect of lowering the melting point of the plating film. The metal elements include nickel, cobalt, gold, bismuth, lead, palladium, antimony, zinc, iron, germanium and indium. The respective contents of the metal elements are preferably less than the copper content.

Furthermore, sulfonate, organic acids, organic acid salts, inorganic acids or inorganic acid salts, which are soluble in the plating mother liquid, can be added to the plating solution together with the sulfonic acid. The acids or salts can be used in such an amount as not to hinder the performance of the plating solution. The inorganic acids include, for instance, sulfuric acid, phosphoric acid, condensed phosphoric acid, nitric acid, hydrofluoric acid, tetrafluorobolic acid and the like. The organic acids include, for example, sulfamic acid, carboxylic acid and phosphonic acid. As the salts of the above acids, any soluble salt can be used, for example, alkali metal salts such as Na salt and K salt, alkaline-earth metal salts such as Ca salt, alkylamine salts such as diethylamine salt, and ammonium salt.

The plating solution preferably contains a specific organic complexing agent as an additive.

Preferred organic complexing agents include mercaptan compounds, thiourea compounds and aromatic amino compounds.

Any of the mercaptan compounds (also called as thiol compounds) may be used as long as it has a SH group in its molecules. Also, the compounds having disulfide bonds may be used so that the compounds are reduced in the plating bath to generate thiol compounds. Any of the thiourea compounds can be used as long as it has a thiourea skeleton. Any of the aromatic amino compounds may be used as long as it has an amino group directly in its aromatic ring. Solubility of these organic complexing agents in the plating mother liquid is preferably high to some extent for preparing a stable plating solution. The solubility is preferably 3 g/L or more, still preferably 5 g/L or more, most preferably 10 g/L or more. In addition, if the molecules of the complexing agents are too large, complexing capability is inclined to reduce. Therefore, molecular weight of the complexing agents is preferably 2,000 or less, still preferably 1,000 or less, most preferably 80 to 500.

Specific examples of the mercaptan compounds are aliphatic thiol compounds such as butanethiol and pentanthiol; aromatic thiol compounds such as thiophenol, toluenethiol and o-aminothiophenol; carboxylic acids containing mercapto group such as mercaptoacetic acid, mercaptosuccinic acid, and mercaptolactic acid; amino acids containing mercapto group such as cysteine; and amino acid derivatives containing mercapto group such as acetylcysteine. Among these mercaptan compounds, the carboxylic acids containing mercapto group, the amino acids containing mercapto group and derivatives thereof are preferable in view of solubility in water, capacity as the complexing agent, and weakness of odor. Especially, acetylcysteine is preferable.

Specific examples of the thiourea compounds are thiourea, dimethylthiourea, trimethylthiourea, N,N'-diisopropylthiourea, acetylthiourea, allylthiourea, 1,3-diphenyl-thiourea, thiosemicarbazide, etc.

Specific examples of the aromatic amino compounds are aniline compounds such as aniline, methylaniline and methoxyaniline; and compounds having two aniline rings in their molecules such as 2,2'-dithiodianiline. In particular, 2,2'-dithiodianiline is preferred.

The amount of the organic complexing agent in the plating solution is preferably in a range of 1 to 100 g/L, still preferably 1 to 30 g/L and most preferably 2 to 20 g/L. The organic complexing agents described above can be used together. Preferably, the mercaptan compounds and aromatic amino compounds are used in combination. Most preferably, acetylcysteine and 2,2'-dithiodianiline are used in combination.

The plating solution can include a surfactant besides the above constituents.

The surfactant is used to improve appearance, fineness, smoothness, adhesiveness and homogeneous electrodeposition of the plating film. As the surfactant, a nonionic surfactant is preferable. Examples of the nonionic surfactant used for the purpose are alkylene oxide compounds which are obtained by addition-condensation of 2-300 of at least one alkylene oxide selected from the group consisting of ethylene oxide (EO) and propylene oxide (PO) with a compound such as $C_1$-$C_{20}$ alkanol, phenol, naphthol, bisphenol, $C_1$-$C_{25}$ alkylphenol, arylalkylphenol, $C_1$-$C_{25}$ alkylnaphthol, $C_1$-$C_{25}$ alkoxyl phosphroric acid (or phosphate), sorbitan ester, styrenated phenol, polyalkylene glycol, $C_1$-$C_{30}$ aliphatic amine, and $C_1$-$C_{22}$ aliphatic amide.

The alkylene oxide compounds are preferable, examples of which include polyoxyethylene alpha-naphthol ether, polyoxyethylene beta-naphthol ether, ethylene oxide-propylene oxide block copolymer, polyoxyethylene alkyl ether, polyoxyethylene phenyl ether, polyoxyethylene alkyl amino ether, polyoxyethylene fatty acid ester, polyoxyethylene polyol ether, polyethyleneglycol and polypropylene glycol.

In a case of adding the surfactant, the amount of the surfactant is preferably 0.1 to 50 g/L, still preferably 2 to 10 g/L. Further, in a case of separating the cathode side from the anode side by the diaphragm, the amount of the surfactant in the plating solution on the cathode side, which is a plated side, is preferably in the above ranges. Moreover, the amount of the surfactant on the anode side is preferably higher than that on the cathode side, specifically in a range of 3 to 15 g/L, still preferably 5 to 12 g/L.

The plating solution can include an aldehyde compound as a brightener for the surface of the plating film.

Specific examples of the aldehyde compound include 1-naphthaldehyde, 2-naphthaldehyde, o-chlorobenzaldehyde, m-chlorobenzaldehyde, p-chlorobenzaldehyde, 2,4-dichlorobenzaldehyde, acetaldehyde, propionaldehyde, salicylaldehyde, 2-thiophenealdehyde, 3-thiophenealdehyde, o-anisaldehyde, m-anisaldehyde, p-anisaldehyde, salicylaldehydeallylether and 2-oxy-3-methoxybenzaldehyde.

In the case of adding the aldehyde compound, the amount thereof is preferably in a range of 0.001 to 10 g/L, still preferably 0.05 to 0.5 g/L.

Depending on a purpose, the plating solution can include various heretofore-known additives besides the above constituents, such as antioxidants, pH adjusters, buffers or the like.

(Method for Preparing Plating Solution)

Next, a method for preparing a plating solution according to one embodiment of the present invention is described. In preparing the plating solution, each of the above-mentioned constituents needs to be dissolved in a mixture of water and the sulfonic acid. It is found that the plating solution is stabilized by specifying the sequence of the dissolution. In preparation of a conventional binary plating solution, there is no special limitation on the order of dissolving the respective metal constituents and additives in water. However, in preparation of the tin-silver-copper ternary plating solution, the order of dissolving the metal constituents and additives in water is important.

In addition, since the plating solution has a high metal concentration, unevenness tends to occur in preparation especially when a large amount of the plating solution is prepared on an industrial scale.

Among the respective constituents in the plating solution, the metal constituents have relatively low solubility in water; thus, the metal constituents need to be mixed in the presence of a certain amount of the sulfonic acid. Accordingly, it is preferable to prepare a basis-solution first with not less than 30 weight percent of water to be contained in the finished plating solution and not less than 50 weight percent of the sulfonic acid to be contained in the finished plating solution, and then, to mix the metal constituents in the basis-solution.

Particularly, it is preferable to prepare the solution by dissolving a given amount of the tin compound after dissolving given amounts of the copper and silver compounds in the basis-solution containing the sulfonic acid as its primary constituent.

Moreover, it is preferable to dissolve the copper compound after dissolving the silver compound. The silver compounds, particularly silver oxide, are less soluble than the copper compounds. Accordingly, the copper compounds and silver compounds can be dissolved well in the basis-solution by dissolving the copper compounds after dissolving the silver compounds in the basis-solution containing the sulfonic acid as its main constituent.

Alternatively, it is also possible to prepare the plating solution by dissolving given amounts of the copper and silver compounds separately in divided basis-solutions, blending the solutions to make a mixed solution and further dissolving a given amount of the tin compound in the mixed solution. In this process, the copper and silver compounds can be well dissolved in the basis-solution because the compounds are separately dissolved in the divided basis-solutions containing sulfonic acid as its main constituent.

In this case, it is preferable to use the basis-solution having not less than 50 weight percent of the sulfonic acid to be contained in the finished plating solution and not less than 30 weight percent of water to be contained in the same. In the tin-silver-copper plating solution, the metal constituents i.e. tin, silver and copper need to be dissolved as ions. However, since the solubility of the constituents in water is not very high, the metal constituents need to be mixed in the presence of the sulfonic acid. Therefore, it is preferable to prepare the basis-solution with not less than 50 weight percent of the sulfonic acid to be contained in the finished plating solution and not less than 30 weight percent of water to be contained in the same, and then to mix the metal constituents in the basis-solution. In preparing the basis-solution, if the amount of the sulfonic acid is less than 50 weight percent of that in the plating solution, the metal compounds may not be dissolved. Also, if the amount of water is less than 30 weight percent of that in the plating solution, concentrations of the metal compounds become temporarily too high to obtain a homogeneous plating solution.

The amount of water used for the basis-solution is preferably 30 to 90 weight percent of the water to be contained in the plating solution, still preferably 30 to 80 weight percent. Moreover, the amount of the sulfonic acid used for the basis-solution is preferably 50 to 100 weight percent of the sulfonic acid to be contained in the plating solution, more preferably 70 to 100 weight percent, and most preferably 80 to 97 weight percent.

Furthermore, it is preferable to add the complexing agents after dissolving the copper and silver compounds in the basis-solution, but before dissolving the tin compounds. Here, the complexing agents serve to turn the metal ions into complex ions. Being the complex ions, the copper and silver ions can be stabilized in an ionic state in the sulfonic acid aqueous solution. Specifically the complexing agents are the aforementioned mercaptan compounds, thiourea compounds and aromatic amino compounds.

(Electrolytic Plating Method)

As an electrolytic plating method according to the present invention, conventional methods can be employed as long as said tin-silver-copper plating solution is used. Any of electrolytic plating methods such as high-speed plating, rack plating and barrel plating can be used without limitation.

As anodes used in the electrolytic plating method of the present invention, only soluble anodes are used or a soluble anode and an insoluble anode are employed. Preferably, the soluble anode and the insoluble anode are employed together.

The soluble anodes used in the present invention contain not less than 90 percent of tin, and the anode can contain one or more of nickel, gold, bismuth, lead, palladium, antimony, zinc, iron, indium and other metals in such an amount as not to deteriorate the quality of the plating solution. By using this soluble anode, it is possible to replenish metal ions, especially $Sn^{2+}$ ions in the plating solution from corresponding metals which constitute the soluble anode.

An object to be plated is used as the cathode in the present invention. The plating object is not particularly limited as long as it is a conductive material, and connecting leads or terminals of electronic components are suitable. The electronic components are, for example, lead frames, chip parts, terminal parts, press parts, crystal oscillators, bumps, connectors, connector pins, various hoop materials, lead pins of packages, pin grid arrays, ball grid arrays, circuits of printed boards, switches, resistors, variable resistors, capacitors, filters, inductors, thermistors and quartz crystals.

When the soluble anode is used, it is preferable to provide a diaphragm to separate the plating solution on the anode side from the plating solution on the cathode side to prevent silver ions and/or copper ions from precipitating by substitution on the anode.

The diaphragm is not particularly specified as long as an appropriate amount of tin ions can pass therethrough. Particularly, it is preferable to use such a diaphragm as transfers $Sn^{2+}$ ions in a range of $5 \times 10^{-5}$ to $5 \times 10^{-4}$ g from the plating solution on the anode side to the plating solution on the cathode side when 1 coulomb of electricity is applied. In the above range, $Sn^{2+}$ ions consumed for forming the plating film can be replenished to the cathode side.

Moreover, the diaphragm preferably allows as little amount of the copper ions and silver ions as possible to pass from the cathode side to the anode side. To effectively prevent silver from precipitating by substitution on the soluble anode, the diameter of pores of the diaphragm is preferably 0.01 to 0.05 μm, more preferably 0.015 to 0.04 μm. In addition, a film thickness is preferably 5 to 100 μm, still preferably 10 to 50 μm, most preferably 20 to 40 μm. A material of the diaphragm is not specifically limited but is preferably a nonionic micro-porous membrane.

In addition, in the case of using the complexing agents such as the mercaptan compounds, it is presumed that the silver ions become larger than tin ions in ionic radius because at least a part of the silver ions become complexes. Accordingly, it is estimated that silver ions exceeding a certain amount are prevented from passing into the anode side.

Current density applied to the cathode side in the electrolytic plating can be between 0.01 and 100 $A/dm^2$ depending on the plating methods.

The tin-silver-copper plating solution according to the present embodiment adopts an appropriate current density especially in a range of 0.01 to 50 $A/dm^2$. In the high-speed plating, the current density is normally 3 to 50 $A/dm^2$, especially 5 to 40 $A/dm^2$. In the rack plating, the current density is normally 0.5 to 5 $A/dm^2$, especially 1 to 4 $A/dm^2$. In the barrel plating, the current density is normally 0.01 to 1 $A/dm^2$, especially 0.05 to 0.5 $A/dm^2$. A plating temperature can be 10 to 50° C., especially 15 to 40° C. An agitation is not necessary but it is possible to use agitation methods such as cathode rocking, agitation by a stirrer, and a liquid flow by a pump.

The above-described plating solution is industrially advantageous in that a plating film with excellent appearance can be formed even in the high-speed plating which is particularly performed with the current density between 5 and 40 $A/dm^2$.

The appearances of the plating films are gloss, semi-gloss, or non-gloss. In the case of obtaining a gloss plating film, a brightener is usually added to the plating solution. For obtaining the gloss plating film, it is preferable to use electric current with a pulse current waveform. When the pulse current waveform is used, frequency is not particularly limited but usually 20 to 100 Hz, and preferably 40 to 70 Hz.

For obtaining the semi-gloss plating film, a flat direct-current waveform is usually preferred. When the direct-current waveform is used, voltage is preferably 1.9 V or less, still preferably 0.2 to 1.2 V.

Next, preferred embodiments of the electrolytic plating method according to the present invention will be described with reference to the drawings.

As shown in FIG. 1, a plating apparatus 10 used in an electrolytic plating method according to a first embodiment of the present invention comprises two soluble anodes 11 containing 90 percent or more of tin, a plating object 12 to be the cathode, a plating solution (on the cathode side) 13 in which metal constituents except tin to be electroplated are dissolved in the sulfonic acid, a plating tank 14 to contain the plating solution 13 and a stirring bar 18 for stirring the plating solution 13 when necessary.

Furthermore, around each soluble anode 11, an anode bag 15 made of a commercially available coarse mesh to cover the soluble anode 11 and remove impurities (especially tin oxide) and a diaphragm 17 to separate a solution 16 around each of the anodes from the plating solution 13 are provided. Thus, the solution around the anodes is called "anode solution" hereinafter in the case of separating the solution around the anodes from the plating solution on the cathode side. The anode solution 16 in the diaphragms 17 includes the sulfonic acid to keep the ionic state of the tin ions. The concentration of the sulfonic acid is in a range of 0.5 to 1.5 mol/L. Within the range, the ionized tin is dissolved by the current and keeps its ionic state, but tin is hard to dissolve chemically.

Furthermore, a nonionic and hydrophilic surfactant is added to the anode solution 16 in higher concentration than that of the surfactant in the plating solution 13 to enhance permeability of tin ions from the anode solution 16 into the plating solution 13.

The electrolytic plating method according to the first embodiment of the present invention comprises steps of filling the plating tank 14 with the plating solution 13, putting the stirring bar 18 in the plating tank 14 for stirring the plating solution 13, wrapping each soluble anode 11 with the anode bag 15, covering each of the anode bags 15 with the diaphragm 17 and putting each of the covered anodes 11 in the plating tank 14. The diaphragm 17 is able to decrease the amounts of the silver ions, copper ions and their complexes permeating from the cathode side to the anode sides. At the same time, the diaphragm 17 allows the tin ions to permeate from the anode side to the cathode side so that at least a part of the tin ions consumed to form the plating film can be replenished. The diaphragm 17 is made of, for instance, a nonionic plastic micro-porous membrane.

After connecting terminals 19 of the soluble anodes 11 and a terminal 20 of the cathode to a power source with pouring the anode solution 16 in the anode bags 15, the current is applied to plate the plating object 12 (the cathode) with tin of the soluble anodes 11 and plating metals in the plating solution 13.

Here, the two soluble anodes 11 are provided symmetrically about one cathode, the plating object 12, because the object 12 can be plated on its both sides by installing the anodes on both sides of the cathode.

Next, an electrolytic plating method according to a second embodiment of the present invention will be described with reference to a plating apparatus "10*a*" shown in FIG. 2.

Figure 2:
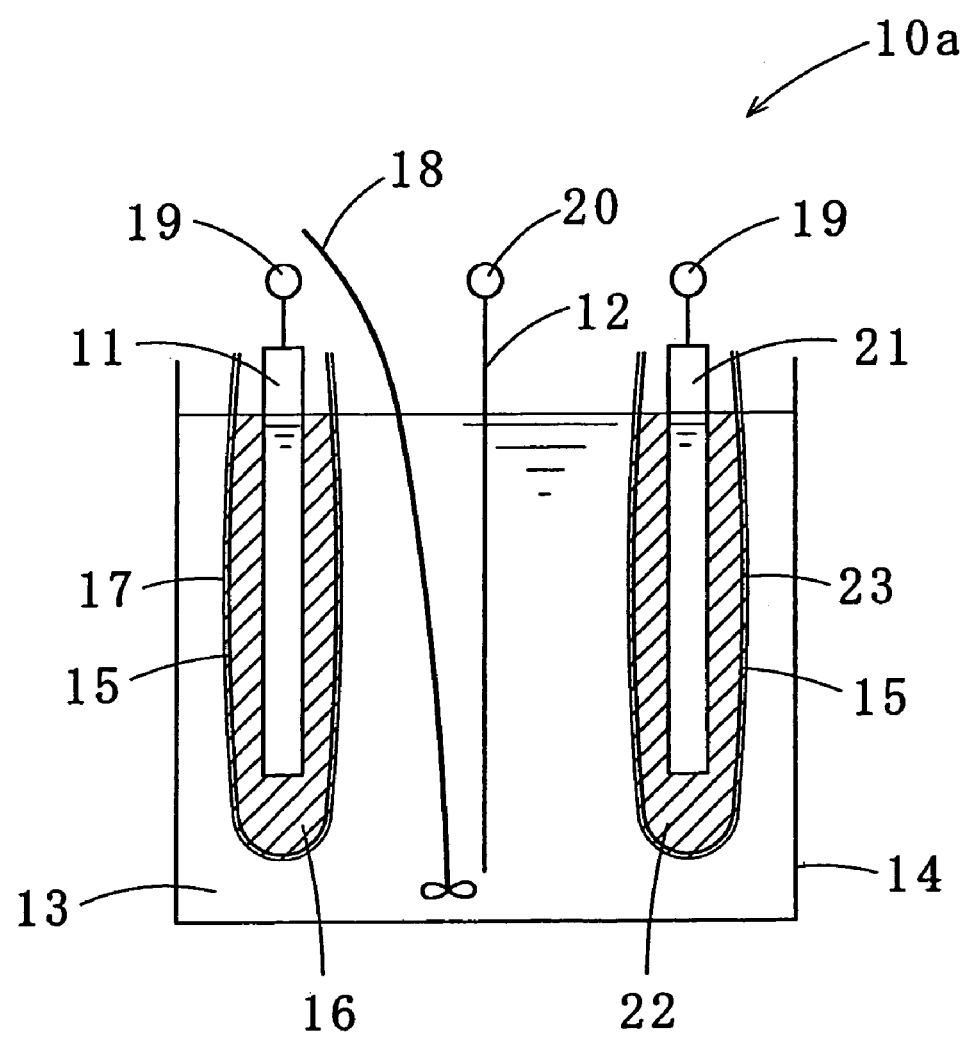
FIG. 2 is an illustrating view of an electrolytic plating apparatus employing an insoluble electrode for use in an electrolytic plating method using a tin-silver-copper plating solution according to a second embodiment of the present invention.

The present embodiment, as shown in FIG. 2, is substantially the same as the first embodiment except the following points. One of the above-mentioned two soluble anodes 11 of the first embodiment is replaced with an insoluble anode 21 surrounded with a diaphragm 23. Plating current is passed to both the soluble anode 11 and insoluble anode 21 to prevent the silver ions in the plating solution 13 from contacting the insoluble anode 21. The current amount applied to the soluble anode 11 is substantially matched with equivalent current amount of tin to be plated on the plating object 12. Except the above points, the electrolytic plating method of the present embodiment is similar to the first invention. Therefore, the detailed description thereof is omitted. Here, the diaphragm 23 covering the insoluble anode 21 can be either the same as or different from the diaphragm 17 covering the soluble anode 11 as long as the diaphragm can prevent the silver ions from contacting the insoluble anode 21 and passes the current.

As the insoluble anode 21, a conventionally used insoluble anode made of, for example, platinum, platinum-plated titanium, carbon or the like is used. A solution 22 around the insoluble anode 21 is only the methanesulfonic acid.

Further, in the second embodiment, it is optional to add a hydrophilic nonionic surfactant together with the methanesulfonic acid to the anode solution 16.

Furthermore, an electrolytic plating method according to a third embodiment of the present invention will be described hereinafter with reference to a plating apparatus "10*b*" shown in FIG. 3.

Figure 3:
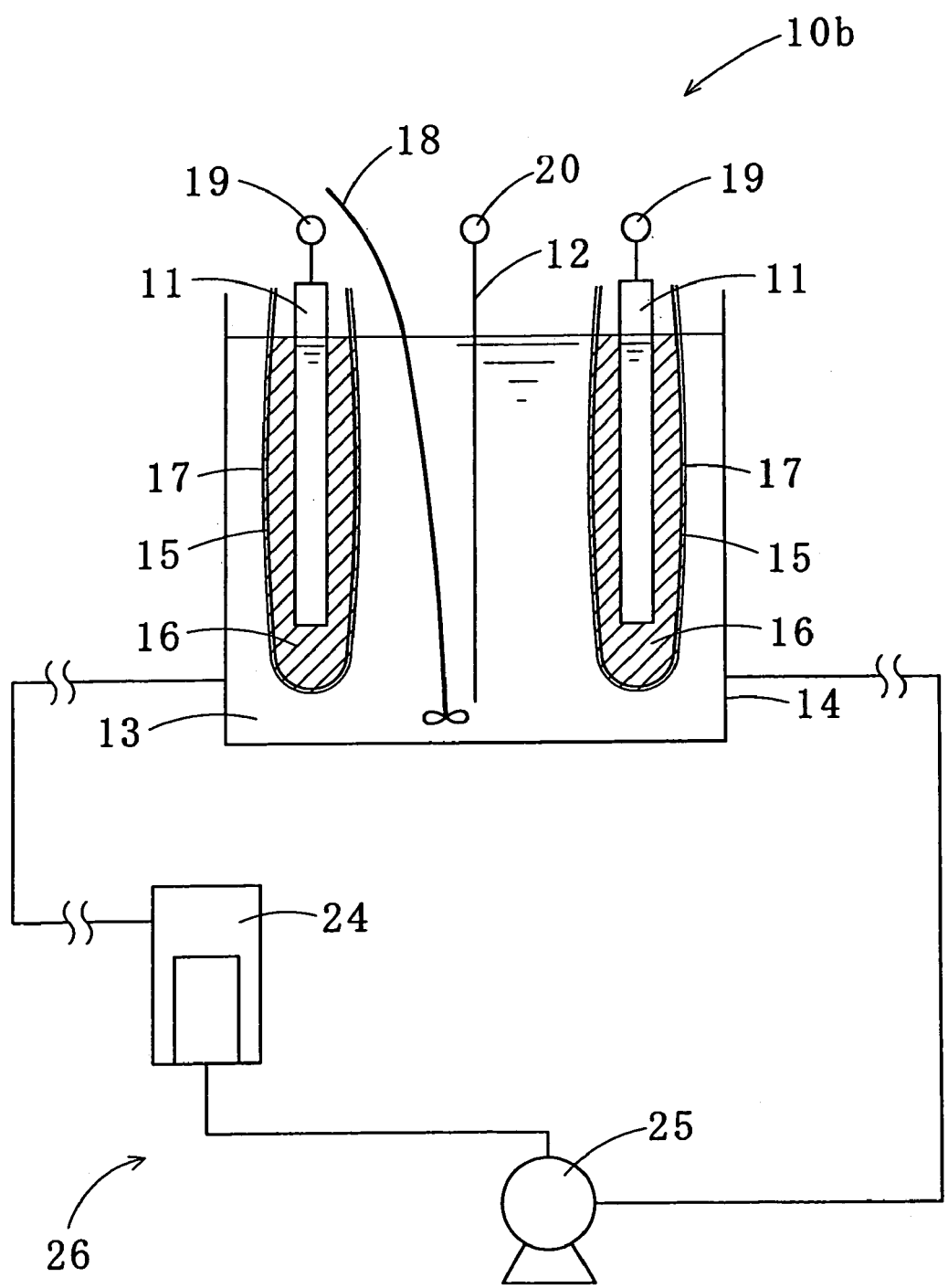
FIG. 3 is an illustrating view of an electrolytic plating apparatus provided with a circulation device having a filtering membrane employed in an electrolytic plating method using a tin-silver-copper plating solution according to a third embodiment of the present invention.

As shown in FIG. 3, in the plating apparatus "10*b*" used in the present embodiment, the plating apparatus 10 of the first embodiment is connected with a circulation path 26 having a filtering membrane 24 which comprises a polyethylene nonwoven cloth coated with cellulose, whose pores are 0.05 to 0.5 μm in diameter, preferably 0.1 to 0.3 μm. The plating solution 13 is passed through the filtering membrane 24 by pressurizing the solution 13 by a pump 25 at a low pressure of 10 to 12 m water head pressure. Accordingly, impurities which are solid substances in the plating solution 13, for example, tin (IV) oxide (also copper oxide and silver oxide) can be removed by filtering, thereby it is possible to prevent the solution quality from deteriorating.

(Control of Plating Solution)

When the electrolytic plating is performed, it is easy to control concentrations of the tin ions, silver ions and copper ions in the plating solution 13 within appropriate ranges. In this case, to obtain intended favorable composition ratio of the plating film and film property stably, it is preferable to analyze the plating bath and replenish these ions in the plating bath so that respective ionic concentrations of the tin, copper and silver can be kept at intended levels. As methods for analyzing the ionic concentrations, volumetric analysis, optical analysis, electroanalysis, thermal analysis, X-ray analysis, spectrophotometry, gravimetric analysis and the like can be used singly or in combination of at least two of them.

These ions of tin, copper and silver, i.e. primary ions in the plating bath are previously compounded in the appropriate concentrations to provide the intended composition ratio of the plating film or film property. However, the ions are consumed as a processing amount of plating increases. Accordingly, the metal ion concentrations in the plating bath fluctuate. However, the concentrations of the ions can be maintained at preset levels by replenishing the same amounts of ions as those of consumed ions by elution from the anodes and/or by supplement of a concentrated solution of metal salts from outside the plating bath.

The volumetric analyses include an oxidation-reduction titration, chelatometric titration, precipitation titration and the like. The optical analyses include spectrophotometry, atomic absorption spectroscopy, inductively coupled plasma-atomic emission spectroscopy and the like. The electroanalyses include polarography, coulometry, potentiometry and the like. The thermal analyses include differential thermal analysis, differential scanning calorimetry and the like. The X-ray analyses include an X-ray diffraction, X-ray fluorescence and the like.

Before replenishing the ions of tin, silver and copper, i.e. primary metal ions, to the plating solution 13, the plating bath can be analyzed with one or more methods selected from the above-mentioned methods. Based on measured concentrations of the metal ions in the plating bath and calculated excess or deficiency thereof, the ions can be replenished by eluting corresponding ions from the anodes and/or by externally supplying metal salts in one or more forms selected from concentrated solution, powder, paste and solid.

Alternatively, when replenishing the metal ions, it is possible to use the above elution from the anode in combination with one or more metal-salt supplements from outside selected from concentrated solution, powder, paste and solid. The combination use of the anodes with the external supplements is preferable so that the impurities may not be introduced into the plating bath. In this case, each metal salt in forms of concentrated solution, powder, paste or solid can also be replenished individually or in combination in order to supply the metal ions. In addition, replenishment of the metal salts in forms of powder, paste and solid requires enough agitation. Thus, the replenishment in the form of the concentrated solution is particularly preferable.

(Plating Film)

The tin-silver-copper plating solution according to the above embodiments not only has the specific composition ratios of tin, silver and copper but also is substantially lead-free. A plating film formed by the electrolytic plating using the plating solution has soldering joining strength comparable to that of a conventional tin-lead alloy plating film. Therefore, the plating solution 13 of the embodiments can form a plating film superior in solderability when connecting leads or terminals of electronic components are the plating objects 12. In the embodiments, the plating object 12 is preferably a metal substrate made of copper, nickel, iron or an alloy containing one or more thereof.

The plating film according to one embodiment of the present invention which is obtained in the above-mentioned manner (hereinafter, simply called "plating film") contains 2.6 to 3.4 weight percent of silver, preferably 2.7 to 3.3 weight percent, further preferably 2.8 to 3.2 weight percent. The plating film contains 0.4 to 0.7 weight percent of copper, preferably 0.4 to 0.6 weight percent, further preferably 0.45 to 0.55 weight percent. If the contents of silver and copper are within the above ranges, the plating film has a low melting point.

Additionally, although the metal content of the plating film is substantially tin except silver and copper, the plating film can contain metal elements in such a trace amount as not to hinder the characteristics of the invention, i.e. the effect of lowering the melting point of the plating film. The metal elements in trace amounts are such as nickel, cobalt, gold, bismuth, lead, palladium, antimony, zinc, iron, indium and the like. Contents of the elements are preferably less than the copper content, further preferably 0.1 weight percent or less.

A thickness of the plating film is not specifically limited. However, the thickness is preferably 3 to 20 µm, further preferably 4 to 18 µm, most preferably 5 to 15 µm. Soldering with higher joining strength can be performed within the above preferable ranges of the thickness of the plating film. The thin film like this, which can not be obtained by a method like a rolling of a tin-silver-copper alloy, is a novel film obtained by the electrolytic plating method of the present invention practically for the first time.

(Soldering Method)

Next, a soldering method using the plating film according to one embodiment of the present invention will be described.

The plating film is formed on the above-mentioned metal substrates which are plating objects such as the connecting leads or terminals for electronic components or the like. The plated members (the laminated body) are soldered to boards of electronic components, electronic equipment or the like. A solder material containing a soldering alloy is provided on the board. As the soldering alloy, for example, a tin-silver-copper alloy is used, and the alloy is usually attached on the board in a state of a solder paste in which the tin-silver-copper alloy is dispersed as metal particles in a highly viscous liquid soldering-activator called as a flux (i.e. resin).

The plating film has favorable joinability especially to a solder paste employing the tin-silver-copper alloy. Since their compositions are so similar that joining strength (soldering strength) can be higher and a melting point can be lower. Therefore, heat quantity required for soldering can be lowered. The plating film is particularly suitable for a case of joining a member provided with the plating film to a board provided with a solder paste using an alloy which contains 2 to 4 weight percent of silver, 0.3 to 0.8 weight percent of copper and the balance substantially tin. Temperature for soldering is 220 to 260° C. at most, preferably 230 to 255° C. If the maximum temperature for soldering is higher than the above temperatures, parts excluding metal of the electric components, the electric equipment or the like tend to be damaged. Meanwhile, if the maximum temperature for soldering is lower than the above temperatures, soldering tends to be insufficient.

Particularly, when an electronic circuit is produced by joining an electronic circuit board to an electronic component under heating, the electronic circuit board being provided with a solder paste using an alloy which contains 2 to 4 weight percent of silver, 0.3 to 0.8 weight percent of copper and the balance substantially tin, the electronic component being coated with a plating film which contains 2.6 to 3.4 weight percent of silver, 0.4 to 0.7 weight percent of copper and the balance substantially tin, the electronic circuit with high strength and good stability can be obtained because the resultant solder is homogeneous and strong.

As to soldering systems, a flow soldering system or reflow soldering system is suitable.

In the flow soldering system, components on which plating films are previously formed are fixed on a printed circuit board, and the components are soldered to the printed circuit board by contacting the components with molten solder. In the reflow soldering system, components on which the plating films are formed are fixed on the printed circuit board after printing the solder paste on the printed circuit board, and the components are soldered to the circuit board by thermal fusion.

EXPERIMENTAL EXAMPLES

Hereinafter, the present invention will be described more specifically with reference to experimental examples. The scope of the present invention is not limited to the experimental examples as long as it does not exceed the gist of the invention.

In order to observe effects of the plating solution, the electrolytic plating method, the plating film and the soldering method in accordance with the present invention, experiments were carried out to measure metal content ratios, finished appearances and melting points of the plating films plated by the electrolytic plating method of the present invention using the plating solution of the present invention. Further, experiments were carried out to measure joining strength and solder wettability of the plating films on test pieces soldered by applying the reflow soldering system according to one embodiment of the present invention.

The tin-silver-copper plating solution according to one embodiment of the present invention was prepared as described below.

A basis-solution was prepared by pouring one-third of water required for preparing the plating solution and a total volume of a 54 weight percent methanesulfonic acid solution into a container for agitation.

Subsequently, a total volume of required silver oxide for the plating was put into the container with stirring the content. Immediately after the content became completely transparent without any black precipitation, a total volume of copper (II) hydroxide for the plating was added. After the copper (II) hydroxide was dissolved completely, acetylcysteine which is an example of the mercaptan compounds, i.e. a complexing agent, was added. After the acetylcysteine was dissolved, 2,2'-dithiodianiline which is an example of aromatic amino compounds, i.e. another complexing agent was added.

When the content became a light-blue gelatinous liquid, tin (II) methanesulfonate was added immediately. Then the content became yellowish transparent. Next, two-thirds of the water required for the plating solution was poured into the container. The preparation of the plating solution was completed by adding 3 g/L of alpha-naphthol-polyethoxylate (EO 10 mol), which is an example of the surfactants, into the container. A plating solution "a" was prepared, in which concentrations of methanesulfonic acid, tin ions, copper ions and silver ions, were 2.64 mol/L, 0.337 mol/L, 0.005 mol/L and 0.0237 mol/L, respectively. Table 1 shows concentrations of constituents in the finished plating solution "a". As comparative examples, compositions of conventional plating solutions "b" and "c" are shown in Tables 2 and 3, respectively.

TABLE 1

Plating Solution "a" (plating solution of the invention)

| Constituents | Amounts |
| --- | --- |
| tin (II) methanesulfonate (as $Sn^{2+}$) | 0.337 mol/L |
| Copper (II) hydroxide (as $Cu^{2+}$) | 0.005 mol/L |
| silver oxide (as $Ag^+$) | 0.0237 mol/L |
| methanesulfonic acid | 2.64 mol/L |
| acetylcysteine | 0.15 mol/L |
| 2,2'-dithiodianiline | 0.025 mol/L |
| alpha-naphthol-polyethoxylate (EO 10 mol) | 3 g/L |

TABLE 2

Plating Solution "b" (comparative plating solution)

| Constituents | Amounts |
| --- | --- |
| tin(II) methanesulfonate (as $Sn^{2+}$) | 0.2 mol/L |
| Copper methanesulfonate (as $Cu^{2+}$) | 0.0025 mol/L |
| silver methanesulfonate (as $Ag^+$) | 0.01 mol/L |
| methanesulfonic acid | 1.0 mol/L |
| acetylcysteine | 0.2 mol/L |
| 2,2'-dithiodianiline | 0.02 mol/L |
| alpha-naphthol-polyethoxylate (EO 10 mol) | 5 g/L |

TABLE 3

Plating Solution "c" (comparative plating solution)

| Constituents | Amounts |
| --- | --- |
| tin(II) methanesulfonate (as $Sn^{2+}$) | 0.1968 mol/L |
| Copper sulfate pentahydrate (as $Cu^{2+}$) | 0.0026 mol/L |
| silver methanesulfonate (as $Ag^+$) | 0.00066 mol/L |
| methanesulfonic acid | 2.0 mol/L |
| L-cysteine | 0.003 mol/L |
| 2,2'-dithiodianiline | 0.02 mol/L |
| alpha-naphthol-polyethoxylate (EO 10 mol) | 3 g/L |

Experimental Example "1a"

With the plating solution "a" shown in Table 1, a plating film was formed by the electrolytic plating method of the present invention as described hereinafter.

500 ml of the plating solution "a" was poured into a beaker. Two rectangular parallelepiped ingots made of pure tin were prepared as soluble electrodes. Then, taken out of the plus side of a rectifier, two wires were firmly fastened on the ingots with clips respectively. Meanwhile, taken out of the minus side of the rectifier, one wire was likewise fastened on a plating object (a 42-alloy test-piece of 0.3 dm$^2$, which comprised 42 weight percent of nickel and 58 weight percent of iron).

The electrolytic plating was carried out at a current density of 5.8 A/dm$^2$ and using an electric current with a direct-current waveform, for 216 seconds at 18° C. As a result, a favorable semi-gross plating film having a thickness of 8 μm was obtained on the 42-alloy test-piece. Then, the plated 42-alloy test-piece was rinsed with tap water sufficiently. Subsequently, the plated test-piece was finished by rinsing with pure water. Afterward, the plated test-piece was dried.

As to the obtained plating film, metal content ratio in the plating film, appearance, joining strength, solder wettability and a melting point were measured or tested by the following methods (1) to (7). The results are shown in the experimental example "1a" in Table 4. As shown in Table 4, the composition of the plating film obtained in the experimental example "1a" comprised 2.81 weight percent of silver, 0.51 weight percent of copper and the balance tin. The solder wettability of the film was favorable, and the melting point was 217° C. which is close to a eutectic point of tin, silver and copper. Therefore, soldering at a low temperature became realizable. Also, the result of the test for joining strength was favorable, i.e., 23.3 N.

(1) The metal content ratio in the plating film was measured with the inductively coupled plasma-atomic emission spectroscopy (ICP emission spectrometry) by dissolving the plated film.

(2) Finished Appearance

As to the electrodeposited film obtained in each plating bath, each film surface was visually observed. If unevenness was not found on the film and the film had a homogeneous white appearance, the film passed the inspection.

(3) Measurement of Joining Strength of the Film

For testing joining strength of the plating film, a test-piece plated with the plating solution "a" shown in Table 1 by the electrolytic plating method according to the experimental example "1a" was soldered to a board by the reflow soldering system according to one embodiment of the present invention as described hereinafter.

Figure 4:
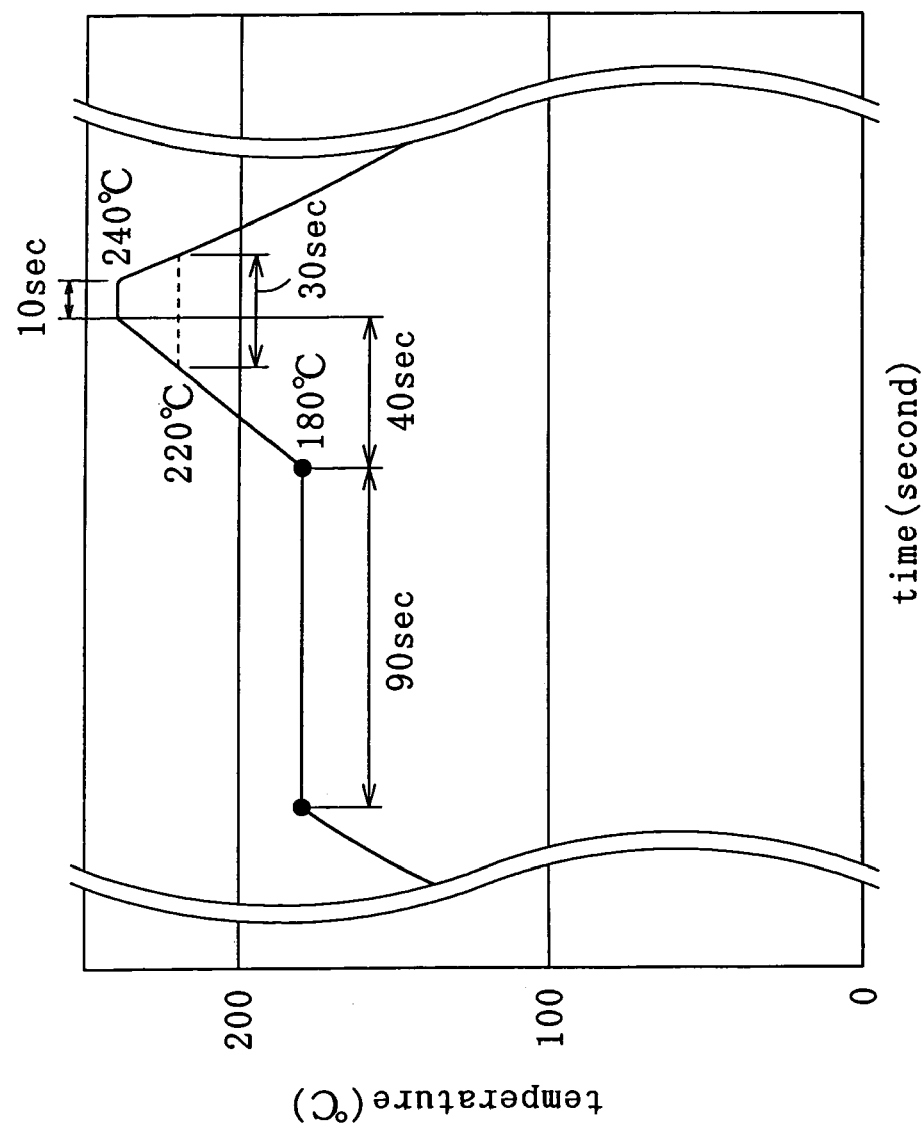
FIG. 4 is a schematic diagram of soldering temperature for heat resistant evaluation of components.

In the soldering method, a solder paste film having a thickness of 0.8 mm was formed by setting a stainless mask (0.8 mm thick) on a copper-coated testing board made from glass epoxy (12 mm by 12 mm, 3 mm thick) and by squeezing a solder paste (the composition of alloy in the paste comprised 3.0 weight percent of silver, 0.5 weight percent of copper and the balance tin) on a land of the board. Then, the mask was dismounted and the plated test-piece in the experimental example "1a" was mounted on the solder paste. The board was placed in a furnace and was heated as shown in the schematic diagram of soldering temperature of FIG. 4. Namely, the board was heated in the furnace for 90 seconds at 180° C., then the temperature was raised to 240° C. in 40 seconds and the temperature was maintained for 10 seconds at 240° C. After that, the board was cooled. In addition, the temperature between temperature rise and fall was kept at 220° C. or more for 30 seconds. After cooling, the board soldered to the test-piece was taken out from the furnace. Measurements were carried out on the joining strength between the board and test-piece with methods described in JIS C 0054 and EIAJET-7403.

(4) The solder wettability was measured with methods described in JIS C 0053 and EIAJET-7401.

(5) The melting points were measured with DSC (differential scanning calorimetry).

(6) Elemental analyses of joined parts were observed by mapping with an EPMA (electron probe X-ray micro analyzer).

(7) Film Thickness of Plating Film

Each film thickness was measured by a film thickness meter using X-ray fluorescence. An alloy containing 3.5 weight percent of silver and the balanced tin was used as a calibration curve.

TABLE 4

| | Material of Test-piece | Current Density (A/dm²) | Copper Content in Film (weight percent) | Silver Content in Film (weight percent) | Appearance | Melting Point (° C.) | Joining Strength (N) | Solder Wettability (Second) Immediately After Plating | Solder Wettability (Second) After 4 Hours Left in Saturated Water Vapor | Whisker Test 80 days | Whisker Test 320 days |
|---|---|---|---|---|---|---|---|---|---|---|---|
| Experimental Example 1a | 42-alloy | 5.8 | 0.51 | 2.81 | Good | 217 | 23.3 | 0.2 | — | — | — |
| Experimental Example 1b | copper | 5.8 | *1 | *1 | Good | 218 | 27.6 | 0.2 | — | — | — |
| Experimental Example 5 | 42-alloy | 11.6 | 0.50 | 3.0 | Good | 218 | 22.4 | 0.2 | — | — | — |
| Experimental Example 6a | 42-alloy | 5.8 | 0.50 | 3.0 | Good | 217 | 21.5 | 0.20 | 0.35 | OK | OK |
| Experimental Example 6b | copper | 5.8 | *2 | *2 | Good | 217 | 27.8 | 0.30 | 0.48 | OK | OK |

*1 The content was not measured but is estimated to be approximately the same as that measured in the experiment 1a.
*2 The content was not measured but is estimated to be approximately the same as that measured in the experiment 6a.

Experimental Example "1b"

Plating was carried out in the same way as that in the experimental example "1a" except the 42-alloy test-piece with an area of 0.3 dm² was replaced with a copper test-piece with an area of 0.3 dm².

The results are shown in the experimental example "1b" in Table 4. Contents of copper and silver in the plating film were not measured. However, the plating film was estimated to have approximately the same composition as that measured in the experimental example "1a".

Each result of the tests was approximately the same as that in the experimental example "1a" except a great improvement in the joining strength of the test-piece with the copper-coated testing board made from glass epoxy. Also, the appearance was acceptable and the melting point became lower.

Experimental Example 2

Plating was carried out in the same way as that in the experimental example "1a" except the density of current with a direct-current waveform was 5.0 A/dm². Even when the plating was carried out with the changed current density, a surface shape observed with an electron microscope was nearly the same as that in the experimental example "1a". Also, the surface shape was smooth, and particles of the surface were uniform-sized without fluctuation.

Experimental Example 3

Plating was carried out in the same way as that in the experimental example "1a" except the density of current with the flat direct-current waveform was 10.0 A/dm². A surface shape observed with the electron microscope was nearly the same as that in the experimental example "1a". Also, the surface shape was smooth and had uniform-sized particles without fluctuation.

Experimental Example 4

Plating was carried out in the same way as that in the experimental example "1a" except the density of current with a direct-current waveform was 15.0 A/dm². A surface shape observed by the electron microscope was nearly the same as that in the experimental example "1a". Also, the surface shape was smooth and had uniform-sized particles without fluctuation.

Judging from the results of the experimental examples 1 to 4, it was found that the electrolytic plating method of the present invention using the plating solution of the present invention can be applied in a wide range of current density and can perform uniform plating even if the current density was fluctuated more or less.

Experimental Example 5

Next, an experiment was carried out in a case of obtaining a gloss plating film. In order to obtain the gloss plating film, plating was carried out with adding brighteners to the plating solution and using electric current with a pulse current waveform (the waveform period was 0.1 second comprising 0.05 second on and 0.05 second off).

A plating solution 4 was prepared by adding 5 ml/L of a brightener 1 (brightener S-2 produced by Dipsol Chemicals Co., LTD.) and 20 ml/L of a brightener 2 (brightener S-3 produced by Dipsol Chemicals Co., LTD.) to the plating solution "a" used in the experimental example "1a". With the plating solution 4, plating was carried out in the same conditions as those in the experimental example "1a" except the current density was 11.6 A/dm² with the electric current having the pulse current waveform. Consequently, a plating film (8 μm) having a favorable gloss appearance was obtained in plating time of 216 seconds.

As to the obtained plating film, its composition and melting point were measured and appearance and solder wettability were tested in the same ways as those in the experimental example "1a". Furthermore, soldering was carried out with a testing board as described above, and the soldering strength was measured. The results are shown in the experimental example 5 in Table 4.

The composition of the plating film comprised 3.0 weight percent of silver, 0.50 weight percent of copper and the balance tin, and the melting point was 218° C. Both the solder wettability and the soldering strength in the plating film were good.

Experimental Example "6a"

Furthermore, a plating film having a thickness of 8 μm on a 42-alloy test-piece was obtained by carrying out plating with the plating solution used in the experimental example "1a" at a current density of 5.8 A/dm² with electric current having a direct-current waveform under a constant temperature of 25° C. for 216 seconds. The composition of the film comprised 0.50 weight percent of copper, 3.0 weight percent of silver and the balance tin. As to the obtained plating film, its appearance, melting point and solder wettability were measured or tested in the same ways as those in the experimental example "1a". Also, soldering was carried out in the same way as that in the experimental example "1a", and joining strength of the soldering was measured. The joining strength was 21.5 N. Further, as a whisker test (i.e. an observation on growing of cat-whisker-shaped tin metal so as to prevent a short-circuit caused by the tin metal growing at the time of plating), a surface of the plating film was scrutinized by an optical microscope at a magnification of ×40 after the plating film had been left for 80 days and 320 days at a temperature of 25° C. and a humidity of 40 percent. The results are shown in the experimental example "6a" in Table 4. No whisker was found after the plating film was left for both 80 and 320 days. The appearance and the solder wettability were acceptable and the melting point was low, i.e. 217° C.

Experimental Example "6b"

Plating was carried out in the same way as that in the experimental example "6a" except the test-piece (42-alloy) used in the experimental example "6a" was replaced with a copper test-piece. The results are shown in the experimental example "6b" in Table 4.

The results were nearly the same as those in the experimental example "6a" except the joining strength was 27.8 N and the solder wettability went slightly worse. Also, an appearance of the plating film and its lower melting point, i.e., 217° C. were favorable. Further, a whisker test was carried out under the same conditions as those in the experimental example "6a". No whisker was found after the plating film had been left for 80 and 320 days. The composition of the film was estimated to be nearly the same as that in the experimental example "6a".

TABLE 5

| | Material of Test-piece | Current Density (A/dm²) | Copper Content in Film (weight percent) | Silver Content in Film (weight percent) | Bismuth Content in Film (weight percent) | Appearence | Melting Point (° C.) | Junction Strength of the Soldering (N) | Solder Wettability (Second) Immediately After Plating | Solder Wettability (Second) After 4 Hours Left in Saturated Water Vapor | Whisker Test 80 days | Whisker Test 320 days |
|---|---|---|---|---|---|---|---|---|---|---|---|---|
| Comparative Example 1 | 42-alloy | 5.8 | 0.32 | 2.22 | 0 | Bad | | | | | — | — |
| Comparative Example 2 | 42-alloy | 5.8 | 0.46 | 0.25 | 0 | Bad | | | | | — | — |
| Comparative Example 3 | 42-alloy | 3 | 0.50 | 1.96 | 0 | Good | 227 | 20.8 | 0.1 | | — | — |
| Comparative Example 4 | 42-alloy | 3 | 0.8 | 0.32 | 0 | Good | 230 | 22.1 | 0.1 | | — | — |
| Comparative Example 5a | 42-alloy | 20.0 | 0 | 3.4 | 0 | Good | 221 | 20.5 | 0.20 | 0.48 | OK | OK |
| Comparative Example 6a | 42-alloy | 10.0 | 1.5 | 0 | 0 | Good | 227 | 19.3 | 0.20 | 0.50 | OK | OK |
| Comparative Example 7a | 42-alloy | 20.0 | 0 | 0 | 3.0 | Good | 226 | 19.9 | 0.22 | 0.50 | OK | OK |
| Comparative Example 5b | copper | 20.0 | *4 | *4 | 0 | Good | 221 | 26.0 | 0.45 | 0.60 | OK | OK |
| Comparative Example 6b | copper | 10.0 | *5 | *5 | 0 | Good | 227 | 25.0 | 0.42 | 0.60 | OK | Bad |
| Comparative Example 7b | copper | 20.0 | *6 | 0 | *6 | Good | 226 | 25.6 | 0.30 | 0.55 | OK | Bad |

*4 The content was not measured but is estimated to be approximately the same as that in the comparative example "5a".
*5 The content was not measured but is estimated to be approximately the same as that in the comparative example "6a".
*6 The content was not measured but is estimated to be approximately the same as that in the comparative example "7a".

Comparative Example 1

With the conventional plating solution "b" (shown in Table 2) containing 0.2 mol/L of tin ion, 0.0025 mol/L of copper (II) ion and 0.01 mol/L of silver ion, plating was carried out in the same way as that in the experimental example "1a".

As to the obtained plating film, the composition was measured and the appearance was tested in the same ways as those in the experimental example "1a". The results are shown in the comparative example 1 in Table 5. The surface of the plating film was rejected due to defective blackish appearance.

Comparative Example 2

With the conventional plating solution "c" (shown in Table 3) containing 0.1968 mol/L of tin ion, 0.0026 mol/L of copper (II) ion and 0.00066 mol/L of silver ion, plating was carried out in the same way as that in the experimental example "1a".

As to the obtained plating film, the composition was measured and the appearance was tested in the same ways as those in the experimental example "1a". The results are shown in the comparative example 2 in Table 5. The surface of the plating film was rejected due to defective blackish appearance.

Comparative Example 3

Plating was carried out in the same way as that in the comparative example 1 except the current density in the comparative example 1 was changed to 3 A/dm$^2$. As a result, to make a plating film of 8 µm needed a longer time, i.e. 234 seconds.

As to the obtained plating film, its composition and melting point were measured and its appearance and solder wettability were tested in the same ways as those in the experimental example "1a". Further, a joining strength of its soldering was measured. The results are shown in the comparative example 3 in Table 5.

The composition of the plating film comprised 1.96 weight percent of silver, 0.50 weight percent of copper and the balance tin. Although the appearance of the film was acceptable, its soldering strength was weaker than that in the experimental example "1a". Also, the melting point was higher, i.e. 227° C.

Comparative Example 4

Plating was carried out in the same way as that in the comparative example 2 except changing the current density in the comparative example 2 to 3 A/dm$^2$. As a result, to make a plating film of 8 µm needed a longer time, i.e. 289 seconds.

As to the obtained plating film, its composition and melting point were measured and its appearance and solder wettability were tested in the same ways as those in the experimental example "1a". Further, a joining strength of its soldering was measured. The results are shown in the comparative example 4 in Table 5.

The composition of the plating film comprised 0.32 weight percent of silver, 0.8 weight percent of copper and the balance tin. The melting point was higher, i.e. 230° C. Also, the appearance was favorable but the joining strength was 22.08 N, which was smaller than that in the experimental example "1a".

Comparative Example "5a"

With a plating solution containing tin and silver as one of other lead-free plating solutions, a tin-silver alloy (96.6 weight percent of tin and 3.4 weight percent of silver) plating film was formed on a 42-alloy test-piece in the same way as that in the experimental example "6a". As to the obtained plating film, its appearance and solder wettability were measured or tested in the same ways as those in the experimental example "1a".

Furthermore, a joining strength of its soldering was measured. Additionally, a whisker test was carried out under the same conditions as those in the experimental example "6a" (at 25° C. and 40 percent humidity). After the soldered plating film had been left for 80 days and 320 days, no whisker was found. The results are shown in the comparative example "5a" in Table 5. Although the appearance and solder wettability were good, the joining strength was weaker, i.e. 20.5 N and the melting point was higher, i.e. 221° C.

Comparative Example "6a"

With a plating solution containing tin and copper as one of other lead-free plating solutions, a tin-copper alloy (98.5 weight percent of tin and 1.5 weight percent of copper) plating film was formed on a 42-alloy test-piece in the same way as that in the experimental example "6a". As to the obtained plating film, its appearance and solder wettability were measured or tested in the same ways as those in the experimental example "1a". Furthermore, soldering was carried out in the same way as that in the experimental example "1a", and then its joining strength was measured. Additionally, a whisker test was carried out under the same conditions as those in the experimental example "6a". The results are shown in Table 5. After the soldered plating film had been left for 80 days and 320 days, no whisker was found. In addition, although the appearance was favorable, the joining strength was weaker, i.e. 19.3 N, and the melting point was higher, i.e. 227° C.

Comparative Example "7a"

With a plating solution containing tin and bismuth as one of other lead-free plating solutions, a tin-bismuth alloy (97.0 weight percent of tin and 3.0 weight percent of bismuth) plating film was formed on a 42-alloy test-piece in the same way as that in the experimental example "6a". As to the obtained plating film, its appearance and wettability were measured or tested in the same ways as those in the experimental example "1a". Furthermore, soldering was carried out in the same way as that in the experimental example "1a", and then its joining strength was measured. Additionally, a whisker test was carried out under the same conditions as those in the experimental example "6a". The results are shown in Table 5. After the plating film had been left for 80 days and 320 days, no whisker was found. In addition, although the appearance was favorable, the soldering strength was weaker, i.e. 19.9 N, and the melting point was higher, i.e. 226° C.

Experimental Example 7

As shown in FIG. 5(a), distribution of silver in a boundary portion 33 between solder paste 31 on a copper-coated testing board 30 made from glass epoxy and a plated copper test-piece 32 which were soldered in the experimental example "6b" was observed by mapping with an EPMA (electron probe X-ray micro analyzer), the boundary portion 33 corresponding to a molten solder portion between the solder paste 31 and plating film. The boundary portion 33 is also referred to as "molten solder part 33" hereinafter.

Figure 5:
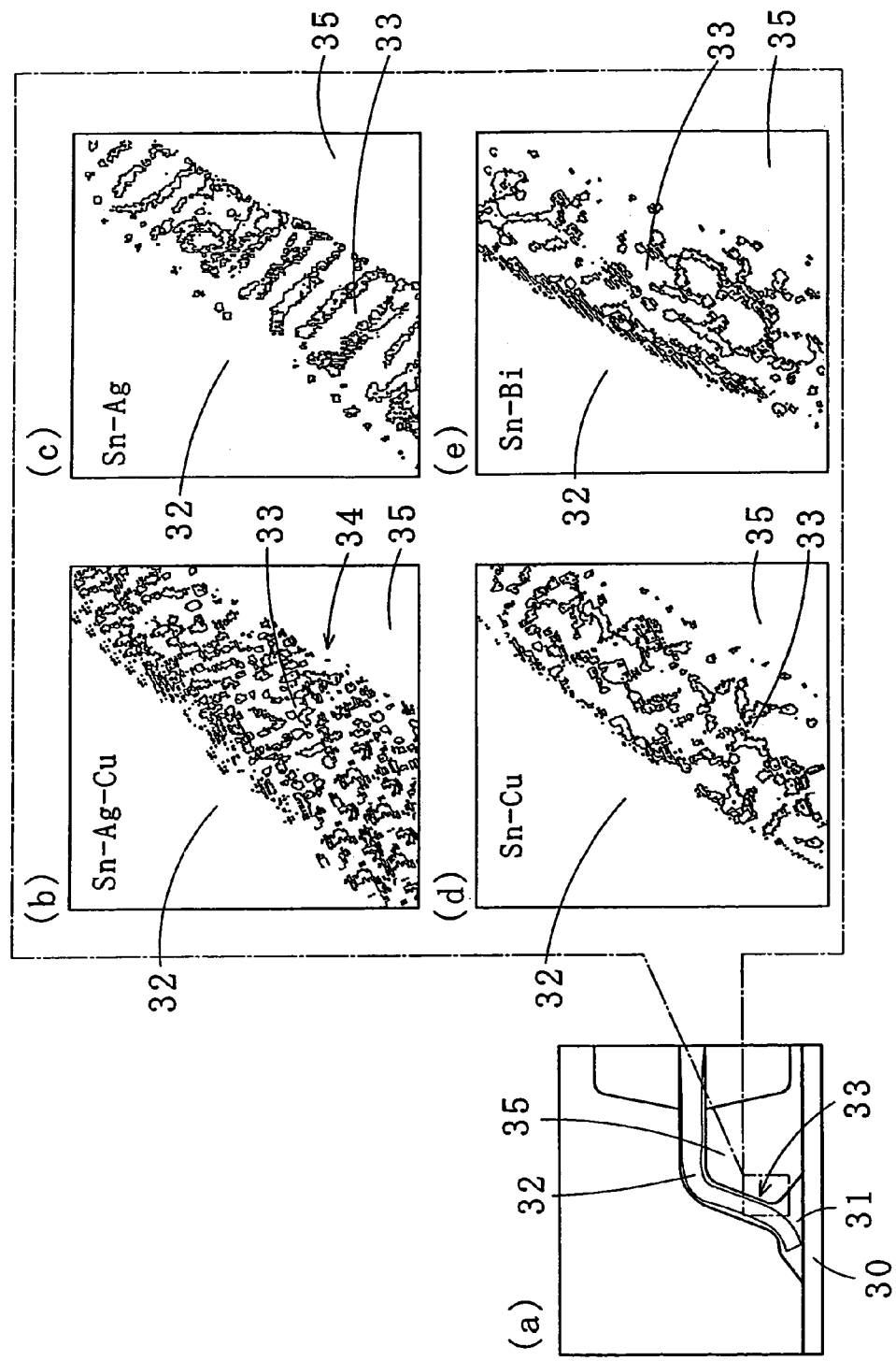
FIG. 5 is a comparative diagram of silver distribution of molten solder parts by type of plating.

As the solder paste 31, a tin-silver-copper alloy (96.5 weight percent of tin, 3.0 weight percent of silver and 0.5 percent of copper) having an approximate eutectic composition was used. In the molten solder part 33 between the solder paste 31 and the tin-silver-copper containing plating film of the invention, as shown in FIG. 5(*b*) illustrating silver distribution. Thus, it is estimated that silver was evenly scattered and formed a $Ag_3Sn$ network (reticulated structure) 34 with a large amount of tin in the solder. In addition, the reference number 35 in FIG. 5 refers to air.

Comparative Example "5b"

With the same plating solution containing tin and silver as that in the comparative example "5a", as one of other lead-free plating solutions, a tin-silver alloy (96.6 weight percent of tin and 3.4 weight percent of silver) plating film was formed on a copper test-piece in the same way as that in the experimental example "6b". As to the obtained plating film, the appearance and solder wettability were measured or tested in the same ways as those in the experimental example "1b". Additionally, a whisker test was carried out under the same conditions as those in the experimental example "6a". The results are shown in the comparative example "5b" in Table 5. After 80 days and 320 days, no whisker was found. The appearance, solder wettability and joining strength were acceptable but the melting point was slightly higher, i.e. 221° C.

Furthermore, soldering was carried out in the same way as that in the experimental example "1b" and its joining strength was measured. Silver distribution in the molten solder part 33 between the soldered plating film and the solder paste was observed by mapping with the EPMA. The results are shown in FIG. 5(*c*).

Comparative Example "6b"

With the same plating solution containing tin and copper as in the comparative example "6a", as one of other lead-free plating solutions, a tin-copper alloy (98.5 weight percent of tin and 1.5 weight percent of copper) plating film was formed in the same way as that in the experimental example "6b". The plating film was tested in the same ways as those in the comparative example "5b". Additionally, a whisker test was carried out under the same conditions as those in the experimental example "6a". The results are shown in the comparative example "6b" in Table 5. Although no whisker was found after the plating film had been left for 80 days, needle crystals were observed after 320 days. The appearance, solder wettability and joining strength were acceptable, however, the melting point was slightly higher, i.e. 227° C.

As to the plating film, silver distribution in the molten solder part 33 between the soldered plating film and the solder paste was observed by mapping with the EPMA in the same way as that in the experimental example 7. The results are shown in FIG. 5(*d*).

Comparative Example "7b"

With the same plating solution containing tin and bismuth as that in the comparative example "7a", as one of other lead-free plating solutions, a tin-bismuth alloy (97.2 weight percent of tin and 2.8 weight percent of bismuth) plating film was formed in the same way as that in experimental example "6b". The film was tested in the same ways as those in the comparative example "5b". The results are shown in the comparative example "7b" in Table 5. The solder wettability and appearance were favorable but the melting point was higher, i.e. 226° C. Moreover, as a result of the whisker test, needle crystals were observed on the film surface of the plating film left for 320 days.

As to the plating film, silver distribution in a molten solder part 33 was observed by mapping with the EPMA in the same way as that in the experimental example 7. The results are shown in FIG. 5(*e*).

As shown in FIG. 5, as to the molten solder part 33 between the solder and plating film of tin-silver, tin-copper or tin-bismuth, silver became porphyritic in each molten solder part 33. Therefore, the presence of the $Ag_3Sn$ network 34 observed in the case of tin-silver-copper plating film was not estimated. Since the $Ag_3Sn$ network 34 is generally said to strengthen joinability between a board and a plating film, the network is inferred to contribute to the strong joinability of the tin-silver-copper containing plating film of the present invention with the board.

Next, solder wettability is compared. As shown in Table 4, the solder wettability of the tin-silver-copper plating film of the present invention on a test-piece containing 42 weight percent of nickel and 58 weight percent of iron (42-alloy) was substantially favorable not only immediately after plating but also after the film had undergone the severe condition that the film had been left in saturated water vapor for 4 hours.

As to the conventional tin-silver plating films in the comparative examples "5a", "5b", the conventional tin-copper plating films in the comparative examples "6a", "6b" and the conventional tin-bismuth plating films in the comparative examples "7a", "7b", joining strength of the plating films on the 42-alloy was weaker, and the melting points of the conventional plating films on both the 42-alloy and the copper test-pieces were higher than those of the experimental examples according to the present invention.

In any plating film according to the present invention, no whisker was observed by said whisker test. In contrast, needle crystals were formed in the conventional plating films of tin-bismuth and tin-copper plated on copper and brass test-pieces using the conventional plating solutions of tin-bismuth and tin-copper after the plating films were left for 320 days at 25° C. and 40 percent humidity, which were the same conditions as those of the invention.

In the result of comparing mountability of the tin-silver-copper containing plating film with that of the conventional plating films using lead frames and boards soldered by the method described in the experimental example "1a", the tin-silver-copper containing plating film on the lead frame of the present invention was soldered to the board with complete fusion, however the tin-silver plating film, tin-bismuth plating film and tin-copper plating film which were conventional plating films were soldered to the board with incomplete fusion.

From the above results, the plating film formed using the plating solution of the present invention was found to be superior in any of appearance, joining strength and solder wettability to other kinds of lead-free plating films. In particular, it is clear that the tin-silver-copper plating film of the present invention is remarkably suitable for a solder using a tin-silver-copper alloy having an approximate eutectic-point composition, the solder being recently used as a base solder for a lead-free solder material (solder paste).

As shown in the above results, the plating films plated on any of the 42-alloy plates and the copper plates using the plating solution "a" of the present experimental example showed favorable appearance, favorable joining strength and substantially favorable solder wettability.

In addition, in the case of plating using the electric current with the pulse current waveform and adding the brighteners to the plating solution "a" of the present experimental example, the plating film having gloss, favorable appearance, solder wettability and soldering strength was obtained.

Also, the plating solution of the invention was found to be able to perform stable plating at a high current density of 4 A/dm² or more and to be applicable to the high-speed plating.

Furthermore, in both plating films on the copper plates and 42-alloy plates, the melting points were 217° C. and 218° C. which are close to the eutectic point of tin, silver and copper alloy. Therefore, soldering at a low temperature became possible as shown in the schematic diagram of soldering temperature in FIG. 4.

Referential Example 1

Next, to study temporal stability of the plating solutions "a", "b" and "c", appearances and light absorbance of the corresponding electrolytic bathes of immediately after their make-ups were compared with those of one month later. The method of measuring the light absorbance was carried out by continuously irradiating light of 800 to 400 nm wavelength after setting a measuring point by irradiating light of 660 nm wavelength to a quartz cell as pure water was on a reference side. Table 6 shows the results of the measurement when the wavelength was 660 nm.

TABLE 6

|  | Immediately After Make-up | (660 nm) One Month Later |
|---|---|---|
| Plating Solution a | 0.037 yellowish transparent | 0.029 yellowish transparent |
| Plating Solution b | 0.285 yellowish emulsion | 0.079 yellowish transparent |
| Plating Solution c | 0.007 yellowish transparent | 0.085 yellowish emulsion |

As shown in Table 6, since the appearance of the plating solution "a" remained transparent without any change at both times of "Immediately After Make-up" and "One Month Later" and its light absorbance did not become higher as shown as 0.029 even after one month, precipitation of impurities in the plating solution "a" is considered to be small in quantity. On the other hand, the conventional plating solution "b" had unfavorable appearance and high turbidity even immediately after the initial make-up of the electrolytic bath. Likewise, since the conventional plating solution "c" had unfavorable appearance after one month, both of the conventional plating solutions were worse in the temporal stability.

From the above results, the plating solution of the present experimental example is found to have better storage stability.

Experimental Example 8

Subsequently, plating was carried out with the plating apparatus 10 shown in FIG. 1 and the plating apparatus "10a" shown in FIG. 2 to confirm the effects of using the diaphragm and the insoluble electrode in the electrolytic plating method of the present invention.

A plating solution having the same composition as that in the experimental example 1 was used.

By covering the soluble anodes 11 with the diaphragms 17, a micro-porous membrane SETERA (registered trademark, produced by Tonen Tapyrus Co. LTD.), intrusion of silver ions from the side of the plating object 12 was inhibited, the SETERA being made from polyethylene with pores of 0.02 μm in diameter and with a thickness of 16 μm. With required amount of current applied under the above condition, plating was carried out. Using calculation by the ICP measurement method the $Sn^{2+}$ concentration in the plating solution 13 rose to 33.7 g/L after plating 6,000 lead frames (6,000 Fr) as plating objects, and to 39.7 g/L after 15,000 Fr, for example. Also, turbidity estimated to be tin oxide occurred in the plating solution 13.

Further, plating was carried out with applying the electric charge of 1.53 F (148,000 Coulomb) to the soluble anodes 11, and tin in the soluble anodes decreased by 85.8 g because of dissolution thereof, however, tin in the plating film was 80.22 g. Stated differently, it is estimated that most of 5.58 g of dissolved tin was dissolved by chemical dissolution. It is also estimated the most of the tin dissolved chemically as surplus $Sn^{2+}$ in the anode solution without contributing to the plating. In addition, although tin of 85.8 g was dissolved on the anode side under the electric charge of 1.53 F, it is estimated that a small amount of the electric charge was also used for plating of silver and copper on the cathode side while the rest of the electric charge was used for plating of tin of 80.22 g.

As a countermeasure, with the plating bath shown in FIG. 2, according to the above calculation, an amount of the electric charge applied to the soluble anode 11 was set at 1.48 F (143,000 coulomb), which was an equivalent amount of electric charge used for plating tin, and the rest of electric charge corresponding to 0.051 F (5,000 coulomb) was applied to the insoluble anode 21 covered with the diaphragm 23. In this way, generation of surplus $Sn^{2+}$ was restrained.

Experimental Example 9

Subsequently, plating was carried out with the plating apparatus 10 shown in FIG. 1 in order to confirm the effects of using the diaphragms in the electrolytic plating method using the tin-silver-copper plating solution of the present invention.

In the plating apparatus 10 shown in FIG. 1, two anode plates made of pure tin (rectangular parallelepiped ingots) were prepared as the soluble anodes 11 containing 90 percent or more of tin and a copper test-piece of 0.3 dm² was prepared as the plating object 12, i.e. a cathode. The 500 ml beaker was used as the plating bath 14. The beaker was filled with the plating solution 13 prepared as above, and the agitator 18 to stir the plating solution 13 was placed in the beaker.

The two soluble anodes 11 wrapped in the anode bags 15 and further covered with the diaphragms 17, respectively, were installed in the plating bath 14. Two wires connected to a plus terminal of a rectifier were firmly fastened on terminals 19 of the soluble anodes 11 with clips, respectively. Similarly, one wire connected to a minus terminal of the rectifier was firmly fastened on a terminal 20 of the plating object 12. The anode solution 16 was made by pouring 80 ml of 54 weight percent methanesulfonic acid (1.05 mol/L) into each of the anode bags 15. Then, an electrolytic plating was carried out by applying 1.5 A of current for 2 hours, i.e. 10,800 coulomb of electric charge in total at a current density of 5.8 A/dm² and with the direct-current waveform.

After the plating, concentrations of $Sn^{2+}$ ions, silver ions and copper ions in the anode solution 16 and the plating solution 13 were measured.

Micro-porous membrane SETERA (registered trademark, produced by Tonen Tapyrus Co. LTD.) was used as the diaphragms 17. SETERA with pores of 0.02 μm in diameter was made from polyethylene with a film thickness of 16 μm.

Experimental Example 10

Plating was carried out in the same way as that in the experimental example 9 except using micro-porous membrane, HIPORE (registered trademark, produced by Asahi Kasei Corporation) as the diaphragms 17. HIPORE was made from polyethylene with pores of 0.02 to 0.04 μm in diameter and with a film thickness of 27 μm.

Referential Example 2

Plating was carried out in the same way as that in the experimental example 9 except using ion permeable membrane, CMX (registered trademark, produced by TOKUYAMA Corp.) as the diaphragms.

The results of the experimental examples 9, 10 and the referential example 2 are shown in Table 7.

From those results, it is clear that the diaphragms 17 used in the present experimental examples have better permeability of $Sn^{2+}$ ions from the anode solution 16 to the plating solution 13. Additionally, the amounts of the permeated silver from the plating solution 13 to the anode solution 16 were 0.44 g/L with SETERA and 0.09 g/L with HIPORE. The amounts are approximately equivalent to or remarkably lower than that of the referential example using CMX (registered trademark).

Therefore, it is clear that the diaphragms 17 used in the present experimental examples are incredibly excellent, having superiority in permeability to tin ions and impermeability to silver ions.

Additionally, in the experimental example 9, when the diaphragms 17 were not used as partitions, blackish deposit of silver compounds estimated to be silver oxide was found around the soluble anodes 11.

Besides, in the electrolytic plating method using the diaphragms 17 of the present experimental examples, each concentration of $Sn^{2+}$, silver ions, and copper ions in the plating solution 13 was stable.

Therefore, covering the anode bath with the diaphragm can prevent silver ions from intruding into the anode bath and depositing on the anode by substituting with tin ions.

TABLE 7

| | Comparison of Ion Amounts in the Anode Bath (g/L) | | | | | | Comparison of Ion Amounts in the Cathode Bath (g/L) | | | | | | Theoretical Precipitation (as Sn) Weight in Plating (g) | Amount of Permeated $Sn^{2+}$ from the Anode Bath to the Cathode Bath |
|---|---|---|---|---|---|---|---|---|---|---|---|---|---|---|
| | Before Plating | | | After Plating | | | Before Plating | | | After Plating | | | | |
| | $Sn^{2+}$ | Ag | Cu | $Sn^{2+}$ | Ag | Cu | $Sn^{2+}$ | Ag | Cu | $Sn^{2+}$ | Ag | Cu | | |
| Experimental Example 9 (SETERA) | 30 | ND | ND | 70 | 0.44 | 0.25 | 40.1 | 2.56 | 0.32 | 31.0 | 2.12 | 0.26 | 6.64 | $1.94 \times 10^{-4}$ |
| Experimental Example 10 (HIPORE) | 30 | ND | ND | 60 | 0.09 | 0.04 | 40.1 | 2.56 | 0.32 | 29.0 | 1.97 | 0.27 | | $1.04 \times 10^{-4}$ |
| Referential Example 2 (CMX) | 30 | 0.09 | ND | 131 | 0.37 | ND | 40.1 | 2.56 | 0.32 | 27.5 | 2.23 | 0.28 | | $3.47 \times 10^{-5}$ |

As shown in Table 7, in the case of using SETERA (registered trademark) with pores of 0.02 μm in diameter and with a film thickness of 16 μm, the amount of the permeated $Sn^{2+}$ from the anode solution to the plating solution during the plating was $1.94 \times 10^{-4}$ g/C. In the case of using HIPORE (registered trademark) with pores of 0.02 to 0.04 μm in diameter and with a film thickness of 27 μm, the amount of the permeated $Sn^{2+}$ from the anode solution to the plating solution during plating was $1.04 \times 10^{-4}$ g/C. On the other hand, in the case of using the ion permeable membrane CMX(registered trademark) as the referential example, the amount of the permeated $Sn^{2+}$ was $3.47 \times 10^{-5}$ g/C. Thus, each of permeability of the diaphragms applied to the experimental examples is 3 to 6 times as high as that of the referential example. This shows the tin ion permeability into the plating solution is remarkably favorable with the diaphragms of the experimental examples.

Additionally, in the case of using the membrane of the referential example, the concentration of $Sn^{2+}$ in the anode solution 16 increased to a large extent and the concentration of $Sn^{2+}$ in the plating solution 13 (the cathode bath) decreased in comparison with the case of using the diaphragms 17 according to the present experimental examples.

Further, tin ions permeate the diaphragm and intrude into the plating bath, which can contribute to the stability of the plating solution.

Above-mentioned results show that industrial productivity improves because composition of the plating solution can be stable for a long time when the plating solution and the anode solution are separated by the nonionic micro-porous membranes.

Experimental Examples 11-16

Subsequently, in the electrolytic plating method with the diaphragms using the tin-silver-copper plating solution of the present invention, plating was carried out with the plating apparatus 10 shown in FIG. 1 to study an elution effect of $Sn^{2+}$ on the plating solution caused by adding a surfactant to the anode baths. Hereat, 54 weight percent methanesulfonic acid (1.25 specific gravity) had a concentration of 150 ml/L (1.05 mol/L) and a concentration of $Sn^{2+}$ was 30 g/L.

In the experimental examples, the apparatus 10 was used, and SETERA (registered trademark) and HIPORE (registered trademark) used in the experimental examples 9 and 10 were employed as the diaphragms 17. Procedures of plating were nearly the same as those in the experimental example "1a". The plating was carried out for 2 hours in the same ways as those in the experimental example 9 except adding a hydrophilic nonionic surfactant together with the methanesulfonic acid into the anode bath and except adding the complexing agents, acetylcysteine and dithiodianiline, in the experimental examples 11 and 14. Alpha-naphthol-polyethoxylate (POEN) was employed as the hydrophilic nonionic surfactant.

After 2-hour plating at 1.5 A (0.3 dm$^2$×5.8 A/dm$^2$), the anode solutions 16 were taken out. Then, the anode solutions were stirred to be samples for the ICP (inductively coupled plasma-atomic emission spectroscopy).

Concentrations of Sn$^{2+}$ and silver ions in the anode solutions 16 after the plating were measured with the ICP.

Table 8 shows the results.

As shown in the experimental examples 11 to 16, the plating was carried out at 1.5 A for 2 hours with adding each of 6.0 g/L, 9.0 g/L and 12.0 g/L of the nonionic surfactant, i.e., POEN, which was higher concentration than 3.0 g/L of the plating solution 13, into the anode solution 16, and the amount of Sn$^{2+}$ ions in the anode solution 16 increased by 20.79 to 47.1 g/L compared to the amount of Sn$^{2+}$ before the plating. On the other hand, in the referential example 3 where water instead of the POEN was added, and in the referential examples 4 and 5 where the same amount of the POEN as that in the plating solution, i.e. 3.0 g/L was added, amounts of Sn$^{2+}$ ions in the anode solution 16 increased by 68.5 to 84 g/L after the plating.

From the above results, in the examples 11 to 16 where the anode solutions had higher POEN concentrations than that in the plating solution, the increase of Sn$^{2+}$ ions in the

TABLE 8

| | | Composition of Anode Bath | | | 2-hour-plating (500 ml, 1.5 A) Anode Bath | |
|---|---|---|---|---|---|---|
| | | | | | Increased | Increased |
| | Membrane | Acetylcysteine (g/L) | 2,2' dithiodianiline (g/L) | POEN (g/L) | Amount of Sn$^{2+}$ (g/L) | Amount of Ag (g/L) |
| Experimental examples | 11 SETERA | 24.5 | 6.2 | 6.0 | 40 | 0.44 |
| | 12 SETERA | 0 | 0 | 9.0 | 20.79 | 0.10 |
| | 13 SETERA | 0 | 0 | 12.0 | 47.1 | 0.72 |
| | 14 HIPORE | 24.5 | 6.2 | 6.0 | 38.2 | 0.39 |
| | 15 HIPORE | 0 | 0 | 9.0 | 43.5 | 0.03 |
| | 16 HIPORE | 0 | 0 | 12.0 | 31.3 | 0.09 |
| Referential Examples | 3 SETERA | 0 | 0 | 0 | 70 | 0.1 |
| | 4 SETERA | 24.5 | 6.2 | 3.0 | 68.5 | 0.17 |
| | 5 HIPORE | 24.5 | 6.2 | 3.0 | 84 | 0.22 |
| | 6 HIPORE 10C | 0 | 0 | 12.0 | 111 | 0.19 |

Referential Example 3

Plating was carried out in the same way as that in the experimental example 11 except adding water instead of adding both of the POEN and complexing agents into the anode bags. The results are shown in Table 8.

Referential Example 4

Plating was carried out in the same way as that in the experimental example 11 except adding 3.0 g/L of the POEN which was the same amount as added to the plating solution into the anode baths. The results are shown in Table 8.

Referential Example 5

Plating was carried out in the same way as that in the experimental example 14 except for adding 3.0 g/L of the POEN which was the same amount as added to the plating solution into the anode baths. The results are shown in Table 8.

Referential Example 6

Table 8 shows the results in a case of employing a HIPORE10C (registered trademark) having a thickness of 100 μm with pores of 0.02 to 0.04 μm in diameter as a diaphragm and adding 12.0 g/L of POEN into the anode bags.

anode solutions 16 after plating was much lower than those of the referential examples 4 and 5. Thus, it is clear that Sn$^{2+}$ ions smoothly transferred into the plating solution 13 through the diaphragms 17.

Furthermore, in the referential example 6 where the HIPORE10C (registered trademark) with a thickness of 100 μm was employed instead of the HIPORE (registered trademark) with a thickness of 20 μm as the diaphragms 17, the concentration of Sn$^{2+}$ in the anode solution 16 increased to a large extent although 12.0 g/L of POEN was added to the anode bags 15. This shows that the permeability of Sn$^{2+}$ from the anode solution to the plating solution 13 was low. Accordingly, it is found that the thickness of the diaphragm is one of important elements, and the conditions of the experimental example 12 are the most favorable among those of the experimental examples 11 to 16.

From the results of the experimental examples 11 to 16 in which the same amount of electric charge was applied to the same anode boards, it was found that Sn$^{2+}$ ions contained in the anode bath moved smoothly into the plating solution when the POEN concentration in the anode bath was set to be higher than that in the plating bath.

Accordingly, when the anode bath was covered with the diaphragm to prevent the plating solution from becoming less stable and deteriorating in quality, there was a problem that the permeability of tin ions from the anode solution to the plating solution became worse because metal separated out around the soluble anode containing not less than 90 percent of tin by substituting the tin for metal ions including silver ions and copper ions but tin ions in the plating solution. To overcome the problem, concentration of POEN in the anode solution was set higher than that in the plating solution, thereby enhancing the permeability of the tin ions from the anode solution to the plating solution.

Further, the complexing agents, i.e., acetylcysteine and dithiodianiline were added to the anode baths in the experimental examples 11 and 14 to prevent the silver ions from depositing by substitution for the tin of the anodes when the silver ions transferred to the anode side. However, the amount of the permeated silver ions was small and actually silver deposition was not observed even in other examples where no complexing agent was added.

Furthermore, if the tin ions in the anode solution permeate into the plating solution too much, the tin ion concentration in the plating solution can be prevented from rising too high by regulating tin ion elution from the soluble anode. The regulation of tin ion elution can be carried out by installing an insoluble electrode covered with a diaphragm besides the soluble anode covered with the diaphragm which separates the anode solution from the plating solution and by adjusting electric current applied to the soluble anode. In this way, it becomes possible to provide the electrolytic plating method whereby the plating solution is stable and resistant to deterioration in quality.

Experimental Example 17

Subsequently, in the electrolytic plating method with the tin-silver-copper plating solution of the present invention, plating was carried out with the plating apparatus "10b" shown in FIG. 3 to confirm an effect of a circulation device provided with the filtering membrane 24.

First, when plating of 46,000 Fr was performed without operating the circulation device provided with the filtering membrane 24, the solution generated white turbidity and the amount of $Sn^{4+}$ in the plating solution became 51.9 g/L. Then filtration of the plating solution was experimented with passing the plating solution through the filtering membrane 24 under 10.0 to 12.0 m water head pressure. As the filtering membrane 24, a cellulose-coated nonwoven polyethylene cloth with pores of 0.2 μm in diameter produced by ADVANTEC MSF INC. was employed.

An inverter motor was employed for driving a pump to adjust the pressure. The pressure was adjusted to a minimum frequency of the inverter motor at which the filtration began. The minimum frequency was 37 Hz and the water head pressure was 11.6 m with 130 L/min of flow volume.

The unprocessed plating solution 13 in which white turbidity generated with $Sn^{4+}$ of 51.9 g/L became transparent with 2.1 g/L of $Sn^{4+}$ by passing through the filtering membrane 24 for 12 hours.

Referential Example 7

In the experimental example 17, as to the plating solution in which white turbidity was caused by the plating of 46,000 Fr, an activated carbon treatment was carried out instead of operating the circulating device provided with the filtering membrane. As a result, the white turbidity in the solution remained, and moreover the solution became dark by the activated carbon.

Subsequently, a treatment with a commercially available flocculant for the lead-free plating was carried out on the plating solution, however, the turbidity was not removed.

Experimental Example 18

The unprocessed plating solution having the white turbidity with $Sn^{4+}$ of 51.9 g/L after the plating of 46,000 Fr was filtered with the cellulose-coated nonwoven polyethylene cloth with pores of 0.2 μm in diameter at a flow rate of 833 ml/min and a frequency of 37 Hz for 12 hours. However, the turbidity of the plating solution was not removed. When the same unprocessed plating solution was circulated through the same filtering membrane at a flow rate of 600 mL/min and a frequency of 40 Hz for 12 hours, the concentration of $Sn^{4+}$ in the plating solution reduced to 25 g/L.

Experimental Example 19

Plating of 46,000 Fr was carried out with operating the circulation circuit 26 from the beginning of the plating under the same conditions as those in the experimental example 17. The plating solution 13 did not generate turbidity and remained constantly transparent.

INDUSTRIAL APPLICABILITY

The tin-silver-copper plating film, and the laminated body and electronic components having the plating film according to the present invention, have lower melting points. Thus, it is possible that the heating temperature lowers when they are mounted and an alloy having a strong joining strength is formed when they are soldered to solder materials.

By the tin-silver-copper plating solution and electrolytic plating method of the present invention, it is possible to form the plating film having a melting point close to a eutectic point of the tin-silver-copper alloy.

In the soldering method of the present invention, the board provided with the solder material having the melting point close to the eutectic point of tin-silver-copper alloy is joined under heating to the material covered with the plating film having the composition similar to the solder material. Thus, remarkably favorable joinability can be obtained, and at the same time soldering can be performed at a low temperature. These not only can prevent damage of the electronic component by the heat but also can reduce the energy consumption.

The electronic circuit of the present invention is highly reliable because it has higher joining strength.

The invention claimed is:

1. An electrolytic plating method, comprising the steps of:
preparing a plating solution comprising water which is a primary medium, a sulfonic acid, and tin, copper, and silver ions, and an organic complexing agent, concentrations of the sulfonic acid, and tin, copper, and silver ions being 0.5 to 5 mol/L, 0.21 to 2 mol/L, 0.002 to 0.02 mol/L, and 0.01 to 0.1 mol/L, respectively, a mole ratio of the silver-ion concentration to the copper-ion concentration being in a range of 4.5 to 5.58;
separating a solution around a soluble anode containing 90 percent or more of tin from the plating solution on a cathode side by a non-ionic micro-porous membrane having a pore diameter of 0.01 to 0.05 μm and a thickness of 5 to 100 μm; and
carrying out electrolytic plating on a plating object to be a cathode.

2. The electrolytic plating method according to claim 1, further comprising:
forming a plating film including 2.6 to 3.4 weight percent of silver, 0.4 to 0.7 weight percent of copper, and a remaining weight percent being tin.

3. The electrolytic plating method according to claim 1, wherein the solution around the soluble anode separated by the micro-porous membrane contains a surfactant in a concentration higher than that of the plating solution on the cathode side.

4. The electrolytic plating method according to claim 1, further comprising:
applying a current to both the soluble anode and an insoluble anode.

5. The electrolytic plating method according to claim 4, further comprising:
applying a part of the current necessary for plating to the soluble anode; and
applying a remainder of the current to the insoluble anode, the part of the current applied to the soluble anode dissolving tin in an amount obtained by subtracting an amount of tin dissolved chemically from an amount of tin to be plated.

6. The electrolytic plating method according to claim 4, further comprising:
separating a solution around the insoluble anode from the plating solution on the cathode side with a non-ionic micro-porous membrane having a pore diameter of 0.01 to 0.05 µm and a thickness of 5 to 100 µm.

7. The electrolytic plating method according to claim 4, further comprising:
providing a circulation path comprising a filtering membrane having a pore diameter of 0.05 to 0.5 µm; and
passing the plating solution through the filtering membrane under a low pressure so as to remove impurities.

8. The electrolytic plating method according to claim 1, wherein the solution around the soluble anode separated by the micro-porous membrane contains the sulfonic acid in a concentration of 0.5 to 1.5 mol/L.

9. The electrolytic plating method according to claim 1, wherein the complexing agent is a mercaptan compound.

10. The electrolytic plating method according to claim 9, wherein the plating solution further comprising an aromatic amino compound.

11. The electrolytic plating method according to claim 9, wherein the plating solution further comprising a nonionic surfactant.

12. The electrolytic plating method according to claim 1, further comprising:
employing barrel plating as the electrolytic plating; and
applying a current density of 0.01 to 100 A/dm$^2$ to the plating object at the time of plating.

13. The electrolytic plating method according to claim 1, further comprising:
applying a current density of 4 to 11.6 A/dm$^2$ to the plating object at the time of plating.

14. The electrolytic plating method according to claim 1, further comprising:
using an electric current with a pulse waveform at the time of plating.

15. The electrolytic plating method according to claim 1, further comprising:
using an electric current with a direct-current waveform at the time of plating.

* * * * *